US008072823B2

(12) United States Patent
Aihara et al.

(10) Patent No.: US 8,072,823 B2
(45) Date of Patent: Dec. 6, 2011

(54) SEMICONDUCTOR MEMORY DEVICE

(75) Inventors: Tomoyuki Aihara, Osaka (JP);
Masanori Shirahama, Shiga (JP);
Yoshinobu Yamagami, Osaka (JP);
Marefusa Kurumada, Kyoto (JP);
Toshikazu Suzuki, Kanagawa (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/910,254

(22) Filed: Oct. 22, 2010

(65) Prior Publication Data

US 2011/0032779 A1 Feb. 10, 2011

Related U.S. Application Data

(63) Continuation of application No. PCT/JP2010/000841, filed on Feb. 10, 2010.

(30) Foreign Application Priority Data

Apr. 28, 2009 (JP) .................................. 2009-109907

(51) Int. Cl.
*G11C 7/00* (2006.01)

(52) U.S. Cl. .................... 365/189.16; 365/145
(58) Field of Classification Search ............. 365/189.16, 365/145
See application file for complete search history.

(56) References Cited

U.S. PATENT DOCUMENTS

| 7,139,187 B2 * | 11/2006 | Suzuki .......................... 365/145 |
| 2003/0185043 A1 | 10/2003 | Masuda |
| 2006/0262635 A1 | 11/2006 | Kanehara |

FOREIGN PATENT DOCUMENTS

| JP | 2002-298586 | 10/2002 |
| JP | 2005-071491 | 3/2005 |
| JP | 2006-323950 | 11/2006 |

* cited by examiner

*Primary Examiner* — Jason Lappas
(74) *Attorney, Agent, or Firm* — McDermott Will & Emery LLP

(57) ABSTRACT

A semiconductor memory device includes a memory cell provided at an intersection of a word line and a bit line, a precharge circuit connected to the bit line, a column select circuit controlled in accordance with a write control signal, and a clamp circuit provided as a write circuit. The clamp circuit includes a transistor configured to control the potential of a selected bit line to a first potential (e.g., 0 V), and a variable capacitor configured to control the potential of the selected bit line to a second potential (e.g., a negative potential) which is lower than the first potential. The capacitance of the variable capacitor decreases when a power supply voltage is increased, whereby the amount of a decrease from the first potential to the second potential is reduced.

39 Claims, 17 Drawing Sheets

(12)  US 8,072,823 B2

SEMICONDUCTOR MEMORY DEVICE

CROSS-REFERENCE TO RELATED APPLICATIONS

This is a continuation of PCT International Application PCT/JP2010/000841 filed on Feb. 10, 2010, which claims priority to Japanese Patent Application No. 2009-109907 filed on Apr. 28, 2009. The disclosures of these applications including the specifications, the drawings, and the claims are hereby incorporated by reference in their entirety.

BACKGROUND

The present disclosure relates to semiconductor memory devices, such as static random access memories (SRAMs) and the like, and more particularly to techniques of controlling voltages of bit lines.

In recent years, as semiconductor microfabrication technologies have been advanced to reduce the sizes of miniature structures, the reliability (resistance to electrical stress, thermal stress, and the like) of semiconductor elements have been degraded.

In general semiconductor memory devices, such as SRAMs, data is written to a memory cell by the potential of one of a pair of bit lines which have been precharged high transitioning from high to low.

For example, Japanese Patent Publication No. 2002-298586 describes a technique of improving a characteristic of write operation to a memory cell at a low power supply voltage by causing the potential of a bit line during data write operation to the memory cell to be smaller than 0 V.

SUMMARY

In Japanese Patent Publication No. 2002-298586, however, because the bit line potential is caused to be smaller than 0 V, a potential difference which is greater than or equal to a power supply voltage VDD is applied to a transistor to which potential differences ranging from 0 V to the power supply voltage VDD used to be applied. Therefore, the electrical stress to the transistor is larger than when potential differences of no higher than VDD is applied. In particular, when the power supply voltage VDD is high, a voltage which is greater than or equal to the breakdown voltage of the transistor is likely to be applied to the transistor.

If a negative potential generation circuit is designed to match a configuration having a great bit line length, the scale of the negative potential generation circuit is greater than necessary for a configuration having a small bit line length. As a result, not only the chip size increases, but also the circuit which has a higher level of capability to generate a negative potential than necessary is provided. Therefore, an excessive voltage drop occurs on a bit line, so that unnecessarily large electrical stress is applied to a transistor connected to the bit line or the like, resulting in acceleration of a degradation in the reliability of the element.

Therefore, the detailed description describes implementations of a semiconductor memory device capable of reducing or preventing the reliability degradation of each element while improving the characteristic of data write operation to a memory cell at a low power supply voltage.

A first example semiconductor memory device of the present disclosure includes a first word line, a pair of first bit lines, a first memory cell connected to the first word line and the pair of first bit lines, a first select circuit configured to select one of the pair of first bit lines, and a write circuit connected via the first select circuit to the pair of first bit lines. The write circuit includes a first control circuit configured to control a potential of the one selected by the first select circuit of the pair of first bit lines to a first potential, and a variable capacitance capacitor configured to control the potential of the selected bit line to a second potential which is lower than the first potential. The second potential is adjusted by a capacitance of the variable capacitance capacitor being changed, depending on a voltage applied to the variable capacitance capacitor.

A second example semiconductor memory device of the present disclosure includes a first word line, a pair of first bit lines, a first memory cell connected to the first word line and the pair of first bit lines, a first select circuit configured to select one of the pair of first bit lines, a write circuit connected via the first select circuit to the pair of first bit lines, and a power supply voltage detector configured to detect whether or not a power supply voltage is higher than or equal to a predetermined voltage value. The write circuit includes a first control circuit configured to control a potential of the one selected by the first select circuit of the pair of first bit lines to a first potential, a second control circuit configured to control the potential of the selected bit line to a second potential which is lower than the first potential, and a third control circuit configured to be controlled to a third potential in accordance with an output signal of the power supply voltage detector. The second control circuit and the third control circuit are connected in parallel to each other.

A third example semiconductor memory device of the present disclosure includes a pair of global bit lines, a precharge control signal, at least one hierarchical array connected to the pair of global bit lines and the precharge control signal, and a write array select signal configured to select one of the at least one hierarchical array to which write operation is to be performed. Each of the at least one hierarchical array includes a pair of local bit lines, a memory array connected to the pair of local bit lines, a precharge circuit connected to the precharge control signal and the pair of local bit lines, a local bit line select switch configured to select one of the pair of local bit lines, and a hierarchical write circuit. The hierarchical write circuit is connected to the write array select signal, and includes a first control circuit including a transistor element, and a second control circuit including a capacitor.

A fourth example semiconductor memory device of the present disclosure includes a pair of global bit lines, at least one hierarchical array connected to the pair of global bit lines, and a write array select signal configured to select one of the at least one hierarchical array to which write operation is to be performed. Each of the at least one hierarchical array includes a pair of local bit lines, a memory array connected to the pair of local bit lines, a local bit line control circuit configured to control the pair of local bit lines, and a hierarchical write circuit. The hierarchical write circuit is connected to the write array select signal, and includes a first control circuit including a transistor element, and a second control circuit including a capacitor.

Thus, the present disclosure provides a semiconductor memory device which can reduce or prevent the reliability degradation of each element while improving the characteristic of data write operation to a memory cell at a low power supply voltage.

DETAILED DESCRIPTION

Figure 1:
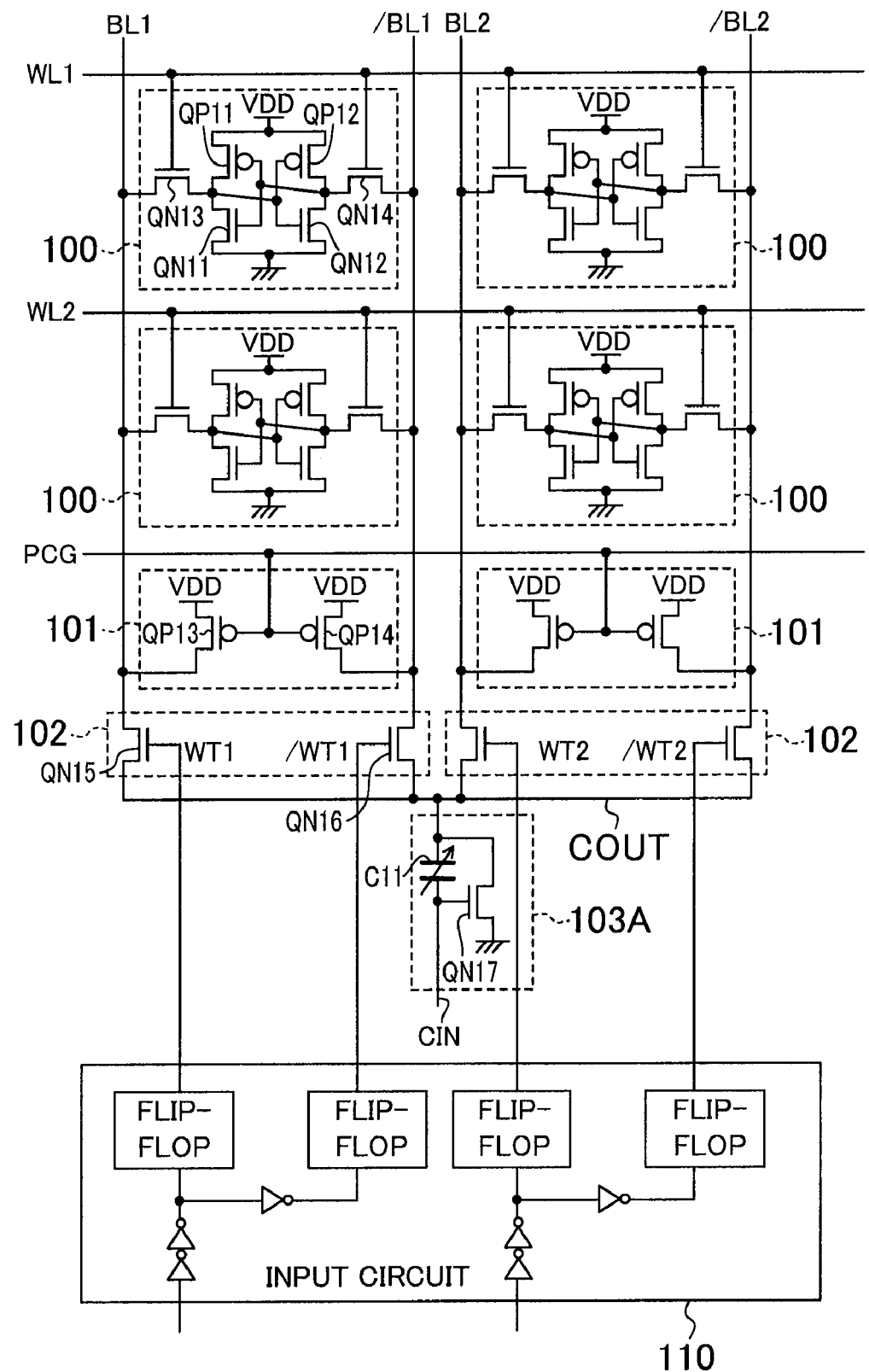
FIG. 1 is a diagram showing a configuration of a semiconductor memory device according to a first embodiment of the present disclosure.

Embodiments of the present disclosure will be described in detail hereinafter with reference to the accompanying drawings. Note that like parts are indicated by like reference characters throughout the specification.

First Embodiment

FIG. 1 is a diagram showing a configuration of a semiconductor memory device according to a first embodiment of the present disclosure. The semiconductor memory device of FIG. 1 includes memory cells 100 each of which includes drive transistors QN11 and QN12, access transistors QN13 and QN14, and load transistors QP11 and QP12, precharge circuits 101 each of which includes P-type MOS (PMOS) transistors QP13 and QP14, column select circuits 102 each of which includes N-type MOS (NMOS) transistors QN15 and QN16, a clamp circuit 103A which includes a variable capacitor C11 and an NMOS transistor QN17, and an input circuit 110.

Moreover, reference characters WL1 and WL2 each indicate a word line, reference characters BL1, BL2, /BL1, and BL2 each indicate a bit line, a reference character PCG indicates a precharge control signal, reference characters WT1, WT2, /WT1, and /WT2 each indicate a write control signal, a reference character CIN indicates a capacitor control signal, a reference character COUT indicates a capacitor output node, and a reference character VDD indicates a power supply.

In each memory cell 100, a pair of the load transistor QP11 and the drive transistor QN11, and a pair of the load transistor QP12 and the drive transistor QN12, each constitute an inverter, and the output terminal of each inverter is connected to an input terminal of the other inverter to form a flip-flop. The flip-flop is used to store and hold data. The gate terminals of the access transistors QN13 and QN14 are connected to the word line WL1 (WL2), and the drain terminals of the access transistors QN13 and QN14 are connected to the bit lines BL1 and /BL1 (BL2 and /BL2), respectively. The source terminals of the access transistors QN13 and QN14 are each connected to an input terminal of the corresponding inverter.

Data is written to a memory cell 100 as follows. After the selected word line WL1 (WL2) has transitioned from low to high (active state), the potential of one of the bit lines BL1 and /BL1 (BL2 and /BL2) which has been precharged high transitions from high to low.

In each precharge circuit 101, the PMOS transistors QP13 and QP14 are connected between the power supply VDD, and the bit lines BL1 and /BL1 (BL2 and /BL2), respectively, and the precharge control signal PCG is connected to the gate terminals of the PMOS transistors QP13 and QP14. When the word line WL1 (WL2) is inactive, the precharge circuit 101 causes the PMOS transistors QP13 and QP14 to turn on with the precharge control signal PCG transitioning low, whereby the bit lines BL1 and /BL1 (BL2 and /BL2) are precharged high. When the word line WL1 (WL2) is active, the precharge circuit 101 causes the PMOS transistors QP13 and QP14 to turn off with the precharge control signal PCG transitioning high, which, in this case, do not affect the bit lines BL1 and /BL1 (BL2 and /BL2).

In each column select circuit 102, the NMOS transistors QN15 and QN16 are connected between the bit lines BL1 and /BL1 (BL2 and /BL2), respectively, and the capacitor output node COUT, and write control signals WT1 and /WT1 (WT2 and /WT2) are connected to the gate terminals of the NMOS transistors QN15 and QN16, respectively. The column select circuit 102 selects the bit lines BL1 and /BL1 (or BL2 and /BL2), and performs a control to determine which of high and low data is to be written to a memory cell 100 connected to the selected bit lines.

For example, a case where low data is written to a memory cell 100 on the bit lines BL1 and /BL1 which is selected by the word line WL1, will be described. In this case, after the precharge control signal PCG transitions high, only the write control signal WT1 transitions high (in this case, the other write control signals /WT1, WT2, and /WT2 are low). Next, the word line WL1 transitions high. As a result, the low data is written to the memory cell 100.

In the clamp circuit 103A, the variable capacitor C11 is connected between the capacitor output node COUT and the capacitor control signal CIN, the NMOS transistor QN17 is connected between the capacitor output node COUT and a ground power supply, and the capacitor control signal CIN is connected to the gate terminal of the NMOS transistor QN17.

Operation of the semiconductor memory device of this embodiment thus configured will be described hereinafter. Firstly, a case where the word lines WL1 and WL2 are inactive will be described. In this case, all the word lines WL1 and WL2 are low, and all memory cells 100 that are controlled by these word lines are in an unselected state (a state in which neither write operation nor read operation is performed). The precharge control signal PCG is also low, and therefore, all precharge circuits 101 that are controlled by the precharge control signal PCG are active, whereby all the bit lines BL1, /BL1, BL2, and /BL2 are precharged high. All the write control signals WT1, /WT1, WT2, and /WT2 are also low, and therefore, all column select circuits 102 that are controlled by these write control signals are inactive. The capacitor control signal CIN is high, and therefore, the NMOS transistor QN17 is turned on, so that the capacitor output node COUT is discharged low.

Figure 2:
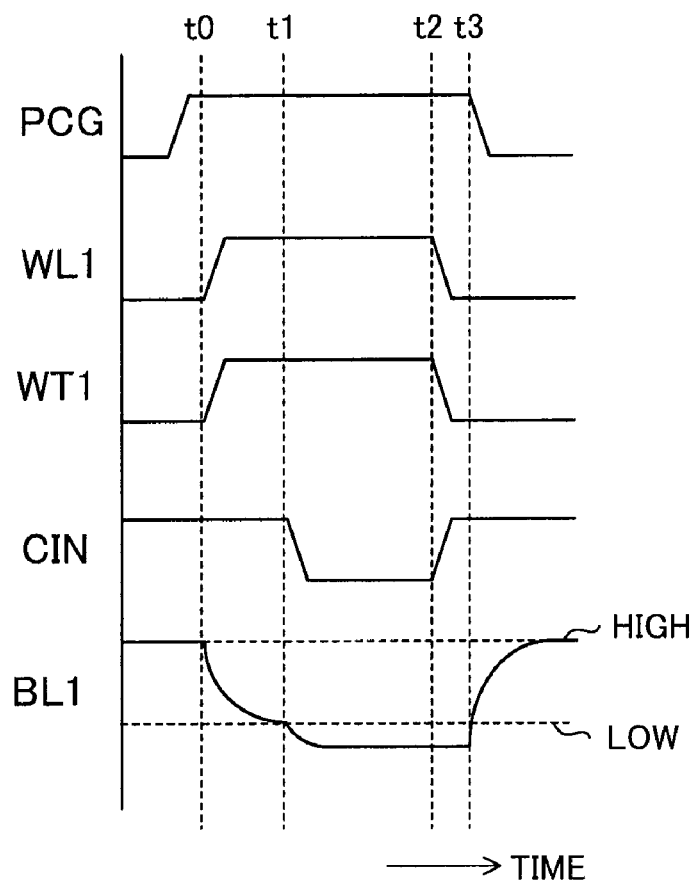
FIG. 2 is a diagram showing waveforms for describing operation of the semiconductor memory device of the first embodiment.

Next, a case where the word line WL1 (or WL2) is activated, and data is then written to a memory cell 100, will be described. A waveform of each signal in this case is shown in FIG. 2. The precharge control signal PCG transitions from low to high, and all precharge circuits 101 that are controlled by the precharge control signal PCG are inactivated. For example, the word line WL1 is selected to transition high, so that the access transistors QN13 and QN14 are turned on. For example, at time t0, the write control signal WT1 is selected to transition high, so that the NMOS transistor QN15 of the column select circuit 102 connected to the bit line BL1 is turned on, whereby the bit line BL1 and the capacitor output node COUT are connected via the NMOS transistor QN15.

At this time, the capacitor control signal CIN is high and the NMOS transistor QN17 is on, and therefore, electric charge is extracted from the bit line BL1 via the NMOS transistor QN17. After a predetermined time has elapsed, the potential of the bit line BL1 transitions low.

After the potential of the bit line BL1 has transitioned low, at time t1 (t0<t1) the capacitor control signal CIN transitions from high to low. Because the capacitor control signal CIN is low, the NMOS transistor QN17 is turned off. At the same time, due to the transition of the capacitor control signal CIN from high (VDD) to low (0 V), electric charge of Cc×VDD (where Cc is the capacitance of the variable capacitor C11) is extracted from electric charge corresponding to the overall capacitance (capacitance C1) existing on the bit line BL1, the capacitor output node COUT, and a memory node (in this case, a node of the source terminal of the access transistor QN13) of the selected memory cell 100. Specifically, because of the distribution of electric charge by the capacitance Cc and the capacitance C1, the potential of the bit line BL1 or the like transitions from 0 V to a negative potential, i.e., −(Cc× VDD)/(Cc+C1).

The potential of the selected bit line BL1 which is lower than 0 V, i.e., is a negative potential, increases the conductance of the access transistor QN13 in the selected memory cell 100. Therefore, data can be written to the memory cell 100 using a power supply voltage which is lower than in a semiconductor memory device in which the lowest potential to which a selected bit line is decreased is 0 V. As described above, data is written to a memory cell 100 by the potential of the selected bit line BL1 transitioning to the negative potential.

Operation of the clamp circuit 103A in this case will be described. When data is written to a memory cell 100, then if a selected bit line (in this case, BL1), the capacitor output node COUT, and the memory node (in this case, the source terminal of the access transistor QN13) of the selected memory cell 100 are at the negative potential, electrical stress to each of elements connected to the nodes are clearly larger than in a semiconductor memory device in which the lowest potential to which a bit line is decreased is 0 V.

When the capacitor C11 which generates the negative potential invariably maintains a constant capacitance Cc', the negative potential generated by the capacitor C11 (VBB=− (Cc'×VDD)/(Cc'+C1)) is proportional to the power supply voltage VDD. Therefore, in the case of a high-voltage power supply, a potential difference (VDD−VBB) applied to elements connected to nodes having the negative potentials is likely to become excessive, leading to a degradation in the reliability of the elements. When the power supply voltage VDD is high, a sufficient conductance can be ensured for the access transistors QN13 and QN14, and therefore, data can be written to a memory cell 100 without decreasing the potential of a selected bit line to the negative potential. Therefore, the potential of a selected bit line may be decreased to the negative potential only when the power supply voltage VDD is low, i.e., it is preferable that the magnitude of the negative potential should be reduced when the power supply voltage VDD is high.

When, as a capacitor for negative potential generation, the variable capacitor C11 dependent on the power supply voltage is used, the capacitance of the variable capacitor C11 decreases with an increase in a voltage applied to the variable capacitor C11. As a result, the capability of the variable capacitor C11 to extract electric charge is reduced, so that the generated negative potential decreases, and therefore, a selected bit line and the like can be controlled so that the potentials thereof are higher than in the conventional art.

Next, as shown in FIG. 2, after completion of data write operation to a memory cell 100, at time t2 the word line WL1 transitions from high to low, so that all the memory cells 100 transitions to the unselected state. Also, the write control signal WT1 transitions from high to low, so that all the column select circuits 102 are inactivated. Also, the capacitor control signal CIN transitions from low to high, so that the NMOS transistor QN17 is turned on, whereby the capacitor output node COUT is discharged low. Thereafter, at time t3, the precharge control signal PCG transitions from high to low, so that all the precharge circuits 101 are activated, whereby all the bit lines are precharged high.

Advantages of this embodiment described above will be described hereinafter. Firstly, when the power supply voltage VDD is low, the characteristic of data write operation to a memory cell 100 can be improved as in the conventional art. Moreover, when the power supply voltage VDD is high, a potential occurring on a selected bit line or the like during data write operation to a memory cell 100 can be controlled so that the potential is higher than in the conventional art, whereby electrical stress to each element connected to the selected bit line or the like can be reduced, whereby the reliability degradation can be reduced or prevented.

Figure 3:
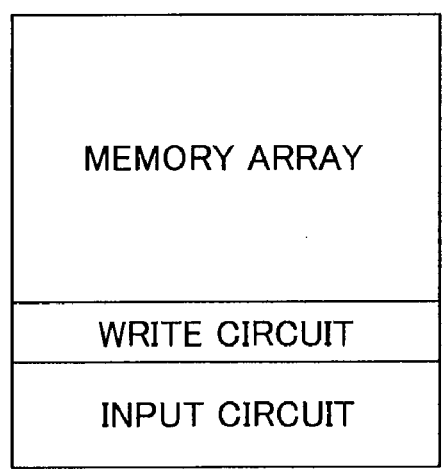
FIG. 3 is a diagram showing a layout of the semiconductor memory device of the first embodiment.

Moreover, in FIG. 1, of two pairs of bit lines for each input circuit 110 which receives data to be written to a memory cell 100, it is a single bit line whose potential is decreased to a negative potential. Even if there are three or more pairs of bit lines connected to each input circuit 110, the number of bit lines whose potentials are decreased to a negative potential is invariably one for each input circuit 110. Therefore, only one write circuit, i.e., the clamp circuit 103A, is required for each input circuit 110, resulting in a reduction in area. In this case, the write circuit may be located adjacent to the input circuit as shown in FIG. 3, whereby interconnection can be simplified, resulting in a further reduction in area.

Figure 4:
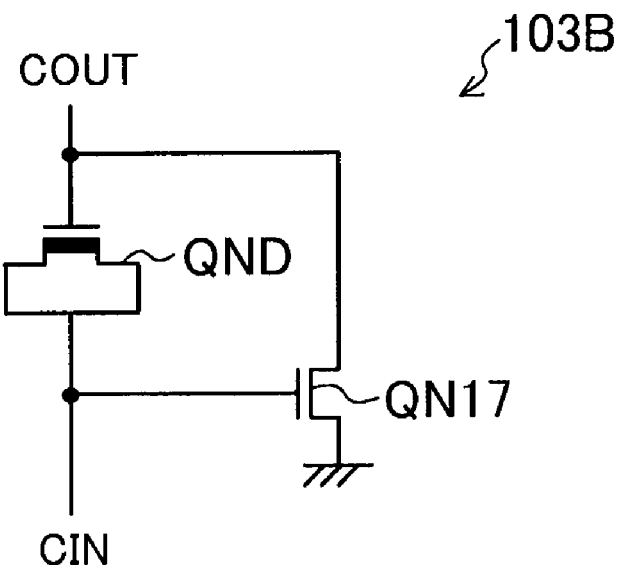
FIG. 4 is a circuit diagram showing an example specific configuration of a clamp circuit included in the semiconductor memory device of the first embodiment.
Figure 5:
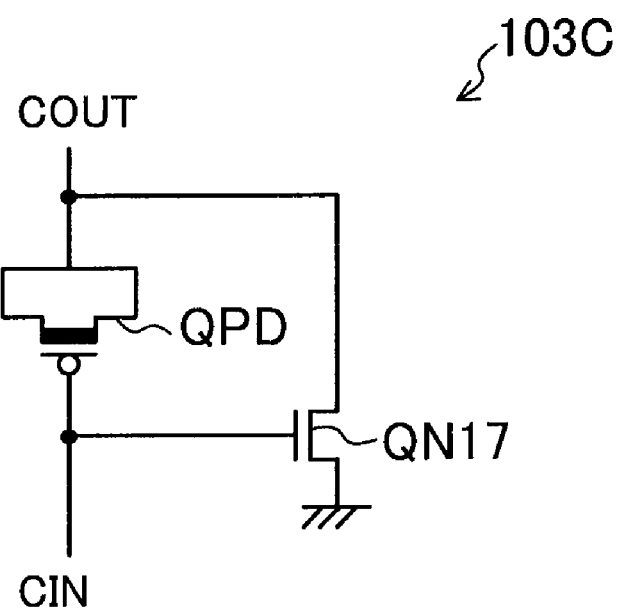
FIG. 5 is a circuit diagram showing another example specific configuration of the clamp circuit included in the semiconductor memory device of the first embodiment.

A specific example of the clamp circuit 103A of the aforementioned embodiment will be described hereinafter. FIGS. 4 and 5 are diagrams showing implementations of the clamp circuit 103A of FIG. 1 using a depletion-mode MOS (DMOS) transistor.

FIG. 4 shows a clamp circuit 103B in which the source and drain and the substrate of an N-type DMOS transistor QND are connected to the capacitor control signal CIN, the gate terminal of the N-type DMOS transistor QND is connected to the capacitor output node COUT, an NMOS transistor QN17 is connected between the capacitor output node COUT and a ground power supply, and the capacitor control signal CIN is connected to the gate terminal of the NMOS transistor QN17.

FIG. 5 shows a clamp circuit 103C in which the source and drain and the substrate of a P-type DMOS transistor QPD is connected to the capacitor output node COUT, the gate terminal of the P-type DMOS transistor QPD is connected to the capacitor control signal CIN, an NMOS transistor QN17 is connected between the capacitor output node COUT and a ground power supply, and the capacitor control signal CIN is connected to the gate terminal of the NMOS transistor QN17.

Figure 6:
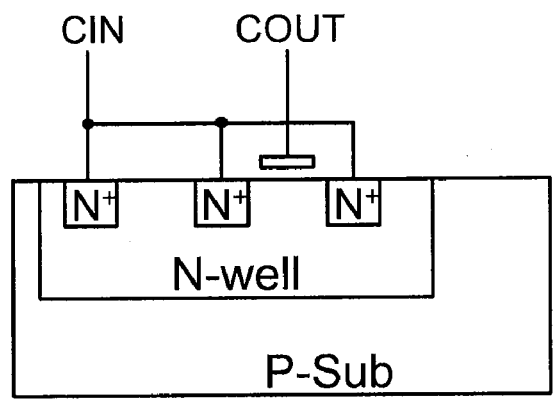
FIG. 6 is a diagram showing a specific configuration of an N-type DMOS transistor included in the clamp circuit of the semiconductor memory device of the first embodiment.
Figure 7:
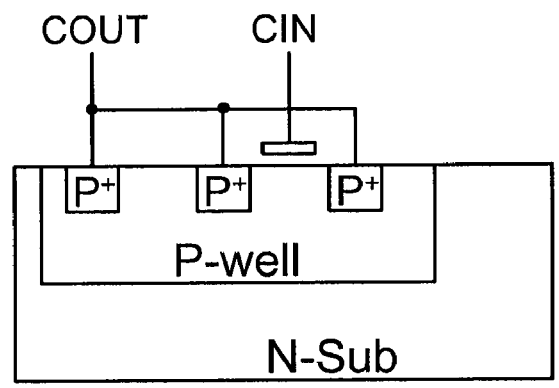
FIG. 7 is a diagram showing a specific configuration of a P-type DMOS transistor included in the clamp circuit of the semiconductor memory device of the first embodiment.
Figure 8:
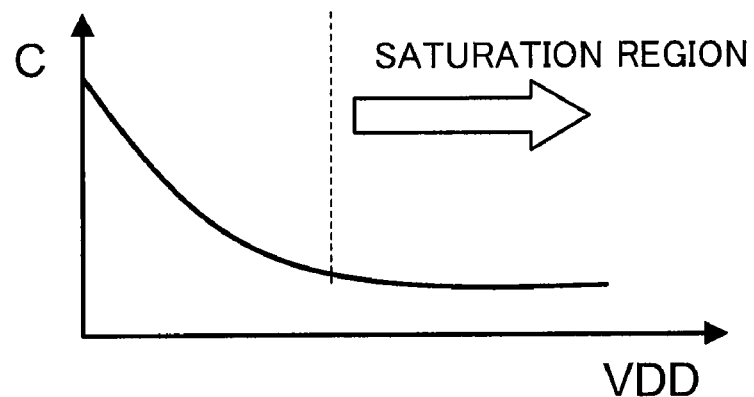
FIG. 8 is a diagram showing characteristics of the DMOS transistor used in the clamp circuit of the semiconductor memory device of the first embodiment.

FIG. 6 shows a configuration of the N-type DMOS transistor QND of FIG. 4, and FIG. 7 shows a configuration of the P-type DMOS transistor QPD of FIG. 5. FIG. 8 shows characteristics of the DMOS transistors QND and QPD. As the voltage VDD applied to the DMOS transistors QND and QPD increases, the element capacitance C decreases. The element capacitance C is saturated when the voltage VDD is greater than or equal to a predetermined voltage. In this case, the thickness of an oxide film used in a low-voltage-operation transistor causes the saturation of the element capacitance C at a low voltage, and therefore, even when the applied voltage VDD is changed in a high-voltage region in which the voltage drop amount should be reduced, the voltage drop amount is not reduced. In contrast to this, by causing the thicknesses of the oxide films in the DMOS transistors QND and QPD to be equal to the thickness of an oxide film in an IO transistor of the LSI, the saturation region can be shifted to a higher voltage, and therefore, even in the high-voltage region, when the applied voltage VDD is changed, the element capacitance C changes, whereby the voltage drop amount can be controlled, and therefore, the reliability degradation can be reduced or prevented.

With the configuration of FIG. 4 or 5, as the voltage of the capacitor control signal CIN which is an input signal to the DMOS transistor QND or QPD increases, the thickness of the depletion layer in the DMOS transistor QND or QPD increases, and therefore, the capacitance of the DMOS transistor QND or QPD decreases. As a result, the electric charge extracting capability of the DMOS transistor QND or QPD decreases, and therefore, a negative potential generated by the DMOS transistor QND or QPD is more reduced when the power supply voltage VDD is high than in the conventional art, whereby the reliability degradation of each element can be reduced or prevented.

Figure 9:
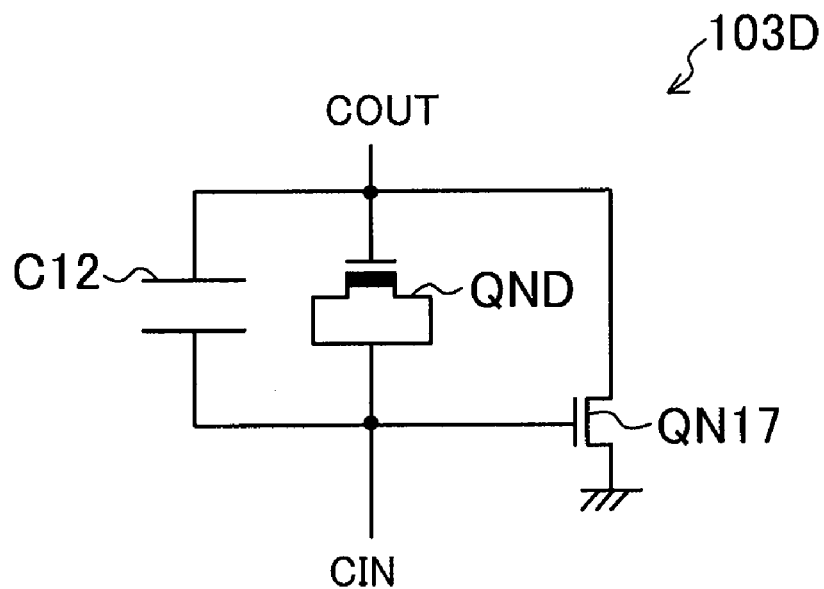
FIG. 9 is a circuit diagram showing another example specific configuration of the clamp circuit included in the semiconductor memory device of the first embodiment.
Figure 10:
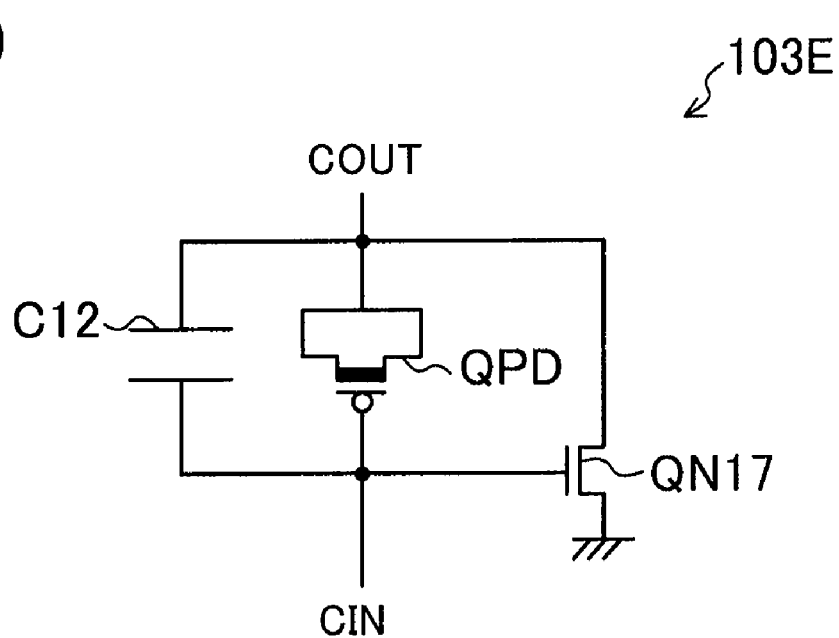
FIG. 10 is a circuit diagram showing another example specific configuration of the clamp circuit included in the semiconductor memory device of the first embodiment.

FIGS. 9 and 10 are diagrams showing other implementations of the clamp circuit 103A of FIG. 1 using a DMOS transistor. In the clamp circuit 103D or 103E shown in FIG. 9 or 10, a constant capacitor C12 is connected in parallel to a DMOS transistor QND or QPD. The DMOS transistor QND or QPD has a smaller capacitance than that of MOS transistors, and therefore, if the DMOS transistor QND or QPD is configured to have a sufficient capacitance to generate a required negative potential, the size of the DMOS transistor QND or QPD is likely to increase. Therefore, by employing the constant capacitor C12 in combination with the DMOS transistor QND or QPD, a required negative voltage can be generated with a smaller area when the power supply voltage VDD is low. Moreover, when the power supply voltage VDD is high, the capacitance of the DMOS transistor QND or QPD is decreased, so that the generated negative potential is more reduced than in the conventional art. As a result, the reliability degradation of each element can be reduced or prevented.

Second Embodiment

Figure 11:
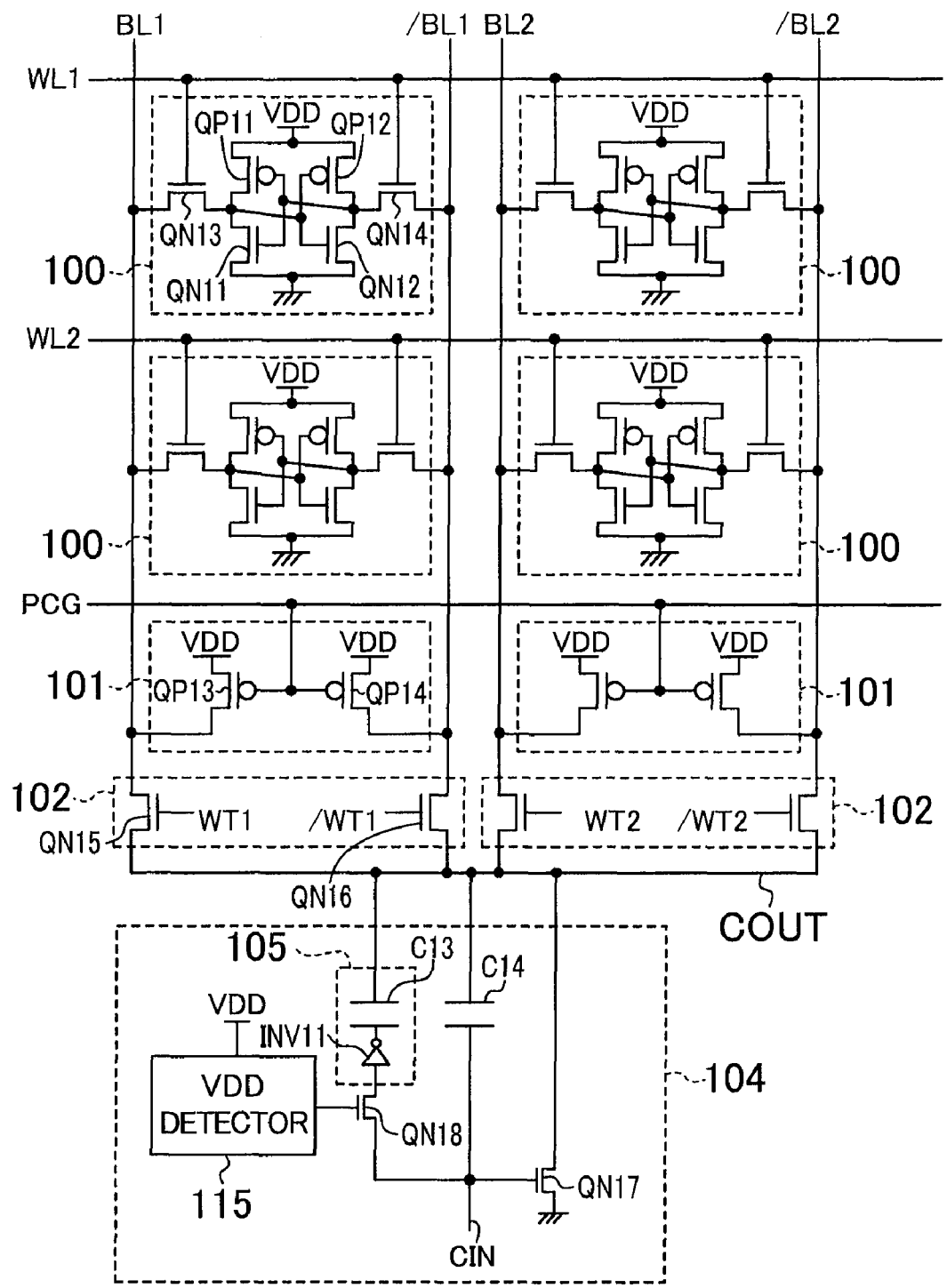
FIG. 11 is a circuit diagram showing a configuration of a semiconductor memory device according to a second embodiment of the present disclosure.

FIG. 11 is a diagram showing a configuration of a semiconductor memory device according to a second embodiment of the present disclosure. The semiconductor memory device of FIG. 11 includes memory cells 100 each of which includes drive transistors QN11 and QN12, access transistors QN13 and QN14, and load transistors QP11 and QP12, precharge circuits 101 each of which includes PMOS transistors QP13 and QP14, column select circuits 102 each of which includes NMOS transistors QN15 and QN16, and a clamp circuit 104. The clamp circuit 104 includes a boost circuit 105 which includes a capacitor C13 and an inverter INV11, a power supply voltage detector 115, NMOS transistors QN17 and QN18, and a capacitor C14.

Moreover, reference characters WL1 and WL2 each indicate a word line, reference characters BL1, BL2, /BL1, and BL2 each indicate a bit line, a reference character PCG indicates a precharge control signal, reference characters WT1, WT2, /WT1, and /WT2 each indicate a write control signal, a reference character CIN indicates a capacitor control signal, a reference character COUT indicates a capacitor output node, and a reference character VDD indicates a power supply.

In each memory cell 100, a pair of the load transistor QP11 and the drive transistor QN11, and a pair of the load transistor QP12 and the drive transistor QN12, each constitute an inverter, and the output terminal of each inverter is connected to an input terminal of the other inverter to form a flip-flop. The flip-flop is used to store and hold data. The gate terminals of the access transistors QN13 and QN14 are connected to the word line WL1 (WL2), and the drain terminals of the access transistors QN13 and QN14 are connected to the bit lines BL1 and /BL1 (BL2 and /BL2), respectively. The source terminals of the access transistors QN13 and QN14 are each connected to an input terminal of the corresponding inverter.

Data is written to each memory cell 100 as follows. After the selected word line WL1 (WL2) has transitioned from low to high (active state), the potential of one of the bit lines BL1 and /BL1 (BL2 and /BL2) which has been precharged high transitions from high to low.

In each precharge circuit 101, the PMOS transistors QP13 and QP14 are connected between the power supply VDD, and the bit lines BL1 and /BL1 (BL2 and /BL2), respectively, and the precharge control signal PCG is connected to the gate terminals of the PMOS transistors QP13 and QP14. When the word line WL1 (WL2) is inactive, the precharge circuit 101 causes the PMOS transistors QP13 and QP14 to turn on with the precharge control signal PCG transitioning low, whereby the bit lines BL1 and /BL1 (BL2 and /BL2) are precharged high. When the word line WL1 (WL2) is active, the precharge circuit 101 causes the PMOS transistors QP13 and QP14 to turn off with the precharge control signal PCG transitioning high, which, in this case, do not affect the bit lines BL1 and /BL1 (BL2 and /BL2).

In each column select circuit 102, the NMOS transistors QN15 and QN16 are connected between the bit lines BL1 and /BL1 (BL2 and /BL2), respectively, and the capacitor output node COUT, and write control signals WT1 and /WT1 (WT2 and /WT2) are connected to the gate terminals of the NMOS transistors QN15 and QN16, respectively. The column select circuit 102 selects the bit lines BL1 and /BL1 (or BL2 and /BL2), and performs a control to determine which of high and low data is to be written to a memory cell 100 connected to the selected bit lines.

For example, a case where low data is written to a memory cell 100 on the bit lines BL1 and BL1 which is selected by the word line WL1, will be described. In this case, after the precharge control signal PCG has transitioned high, only the write control signal WT1 transitions high (in this case, the other write control signals /WT1, WT2, and /WT2 are low). Next, the word line WL1 transitions high. As a result, low data can be written to the memory cell 100.

In the clamp circuit 104, the capacitor C14 is connected between the capacitor control signal CIN and the capacitor output node COUT, the NMOS transistor QN18 and the boost circuit 105 connected in series are connected in parallel to the capacitor C14, and the power supply voltage detector 115 is connected to the gate terminal of the NMOS transistor QN18. In this case, the NMOS transistor QN18 receives a signal from the power supply voltage detector 115, and controls connection and disconnection between the boost circuit 105 and the capacitor control signal CIN. The voltage of the capacitor output node COUT is boosted by driving of the boost circuit 105.

Operation of the semiconductor memory device of this embodiment thus configured will be described hereinafter. Firstly, when write operation is performed, the capacitor control signal CIN transitions from high to low, and the capacitor C14 extracts electric charge from a selected bit line and the like, so that the potentials of the selected bit line and the like are decreased to a negative potential. In this case, unless the power supply voltage VDD is high, the power supply voltage detector 115 outputs a disable signal to turn off the NMOS transistor QN18, and therefore, the boost circuit 105 is disconnected from the capacitor control signal CIN and therefore is not operated, i.e., does not affect the capacitor output node COUT. On the other hand, when the power supply voltage VDD is high, the NMOS transistor QN18 receives an enable signal from the power supply voltage detector 115 to be turned on, so that the boost circuit 105 is connected to the capacitor control signal CIN. When write operation is performed, the capacitor control signal CIN transitions from high to low, and in the boost circuit 105, the capacitor control signal CIN which has been passed through the NMOS transistor QN18 and the inverter INV11 (in this case, the resultant signal is a voltage boosted signal) is input to the capacitor C13. The increase of the applied voltage to the capacitor C13 causes addition of electric charge to the selected bit line and the like connected to the output of the capacitor C13, whereby the voltages of the selected bit line and the like are boosted. Therefore, the negative potential applied to each element connected to the selected bit line and the like is more reduced than in the conventional art, whereby the reliability degradation can be reduced.

Advantages of this embodiment described above will be described hereinafter. Unless the power supply voltage VDD is high, the boost circuit 105 is not operated, and the potentials of the selected bit line and the like are decreased to a negative potential in the same amount as that of the conventional art by the capacitor C14, whereby the characteristic of data write operation to a memory cell 100 can be improved. Moreover, when the power supply voltage VDD is high, the voltage boosting of the boost circuit 105 reduces or prevents the voltage drop of the selected bit line and the like to a negative potential, whereby the reliability degradation of each element connected to a bit line and the like can be reduced.

Third Embodiment

Figure 12:
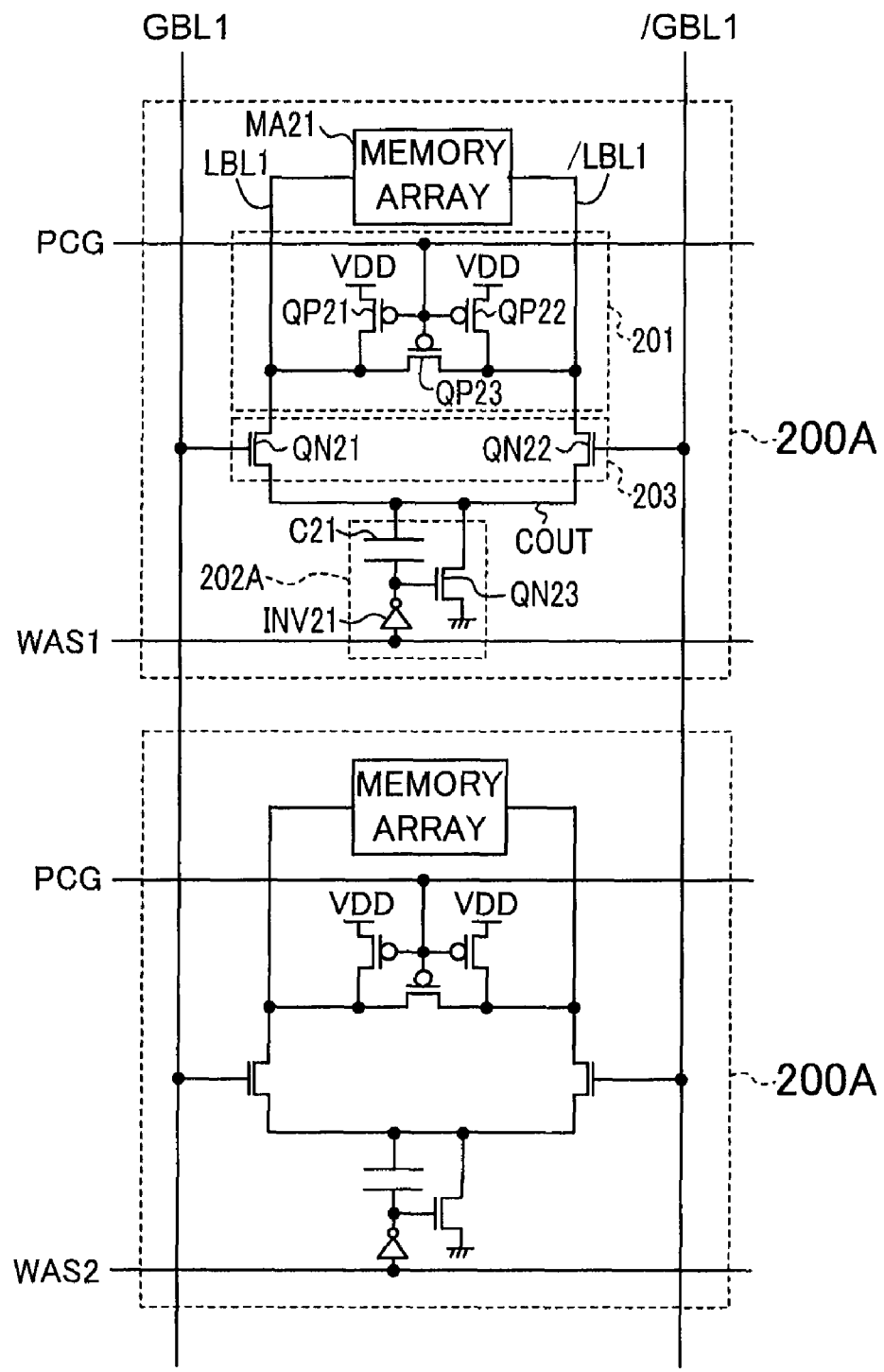
FIG. 12 is a circuit diagram showing a configuration of a semiconductor memory device according to a third embodiment of the present disclosure.

FIG. 12 is a diagram showing a configuration of a semiconductor memory device according to a third embodiment of the present disclosure. The semiconductor memory device of FIG. 12 includes a plurality of hierarchical arrays 200A. Each hierarchical array 200A includes a memory array MA21 which includes a plurality of memory cells, a precharge circuit 201 which includes PMOS transistors QP21, QP22, and QP23, a hierarchical write circuit 202A which includes a capacitor C21, an NMOS transistor QN23, and an inverter INV21, and a local bit line select switch 203 which includes NMOS transistors QN21 and QN22.

Moreover, reference characters LBL1 and /LBL1 each indicate a local bit line, reference characters GBL1 and /GBL1 each indicate a global bit line, a reference character PCG indicates a precharge control signal, reference characters WAS1 and WAS2 each indicate a write array select signal, a reference character COUT indicates a capacitor output node, and a reference character VDD indicates a power supply.

The memory array MA21 is connected to the local bit lines LBL1 and /LBL1. Data is written to a memory cell in the memory array MA21 as follows. After a selected word line (not shown) has transitioned from low to high (active state), the potential of one of the local bit lines LBL1 and /LBL1 which have been previously precharged high transitions from high to low.

In the precharge circuit 201, the PMOS transistors QP21 and QP22 are connected between the power supply VDD, and the local bit lines LBL1 and /LBL1, respectively, the PMOS transistor QP23 is connected between the local bit lines LBL1 and /LBL1, and the precharge control signal PCG is connected to the gate terminals of the PMOS transistors QP21, QP22, and QP23. When the precharge control signal PCG transitions low to turn on the PMOS transistors QP21, QP22, and QP23, the precharge circuit 201 precharges the local bit lines LBL1 and /LBL1 high. When data is written to a memory cell, the precharge control signal PCG transitions high to turn off the PMOS transistors QP21, QP22, and QP23, which therefore do not affect the local bit lines LBL1 and /LBL1.

In the hierarchical write circuit 202A, the inverter INV21 is connected to the write array select signal WAS1 (WAS2). The hierarchical write circuit 202A controls write operation as follows. An output signal of the inverter INV21 is input to the gate terminal of the NMOS transistor QN23 connected between the capacitor output node COUT and a ground power supply, and to the capacitor C21 connected to the capacitor output node COUT, and each input is output to the capacitor output node COUT.

In the local bit line select switch 203, the NMOS transistors QN21 and QN22 are connected between the local bit lines LBL1 and /LBL1, respectively, and the capacitor output node COUT, and the global bit lines GBL1 and /GBL1 are connected to the gate terminals of the NMOS transistors QN21 and QN22, respectively.

Operation of the semiconductor memory device of this embodiment thus configured will be described hereinafter. Firstly, when write operation is not performed, the global bit lines GBL1 and /GBL1 are both held low. Therefore, the NMOS transistors QN21 and QN22 of the local bit line select switch 203 are off, so that the local bit lines LBL1 and /LBL1 and the hierarchical write circuit 202A are disconnected. Also, the precharge control signal PCG is low, and therefore, the precharge circuit 201 which is controlled in accordance with the precharge control signal PCG is activated, whereby the local bit lines LBL1 and /LBL1 are precharged high. Also, the write array select signal WAS1 (WAS2) is low, and therefore, the NMOS transistor QN23 to which a high signal is input via the inverter INV21 is turned on, whereby the capacitor output node COUT is connected to the ground power supply and discharged low.

When write operation is performed, the precharge control signal PCG transitions high, so that the precharge circuit 201 is inactivated. Thereafter, data is set on the global bit lines GBL1 and /GBL1 (e.g., the global bit line GBL1 is high and the global bit line /GBL1 is low), and the NMOS transistor QN21 is turned on. On the other hand, the NMOS transistor QN22 is maintained off. The turned-on NMOS transistor QN21 connects the local bit line LBL1 to the capacitor output node COUT which has been previously connected to the ground power supply via the NMOS transistor QN23, so that the local bit line LBL1 is discharged low.

Thereafter, in a selected hierarchical array 200A, the write array select signal WAS1 transitions from low to high. In this case, an inverted version (signal which has transitioned from high to low) of the write array select signal WAS1 which has been passed through the inverter INV21 is input to the NMOS transistor QN23 and the capacitor C21. As a result, the NMOS transistor QN23 is turned off and therefore the capacitor output node COUT and the ground power supply are disconnected. The capacitor C21 extracts electric charge from the capacitor output node COUT, the local bit line LBL1, and the memory node of a selected memory cell, so that the potentials of a local bit line and the like which have been low are decreased to a negative potential, whereby data is written to the memory cell.

In an unselected hierarchical array 200A, the write array select signal WAS2 is held low, and the NMOS transistor QN23 to which the inverted version of the write array select signal WAS2 is input is held on, so that the local bit line LBL1 maintains connection to the ground power supply, and therefore is held low. The extraction of electric charge by the capacitor C21 does not occur, and therefore, the potential of the local bit line LBL1 is not decreased to a negative potential.

Advantages of this embodiment described above will be described hereinafter. Specifically, this embodiment is directed to a write circuit which invariably has an optimum scale to the memory capacity of a semiconductor memory device. A semiconductor memory device having a desired memory capacity can be designed by connecting a plurality of the hierarchical arrays 200A. Therefore, if the hierarchical write circuit 202A is designed to have an optimum scale to each hierarchical array 200A, it is possible to deal with changes in the memory capacity of a semiconductor memory device by increasing or decreasing the number of the hierarchical arrays 200A connected. Therefore, in a selected hierarchical array 200A, an optimum negative potential is supplied to a local bit line and the like, and therefore, electrical stress more than necessary is not applied to a transistor connected to the local bit line or the like. In an unselected hierarchical array 200A, the potential of a local bit line is not decreased to a negative potential, and therefore, electrical stress applied to a transistor is reduced. As a result, the reliability degradation can be more reduced than in the conventional art.

Fourth Embodiment

Figure 13:
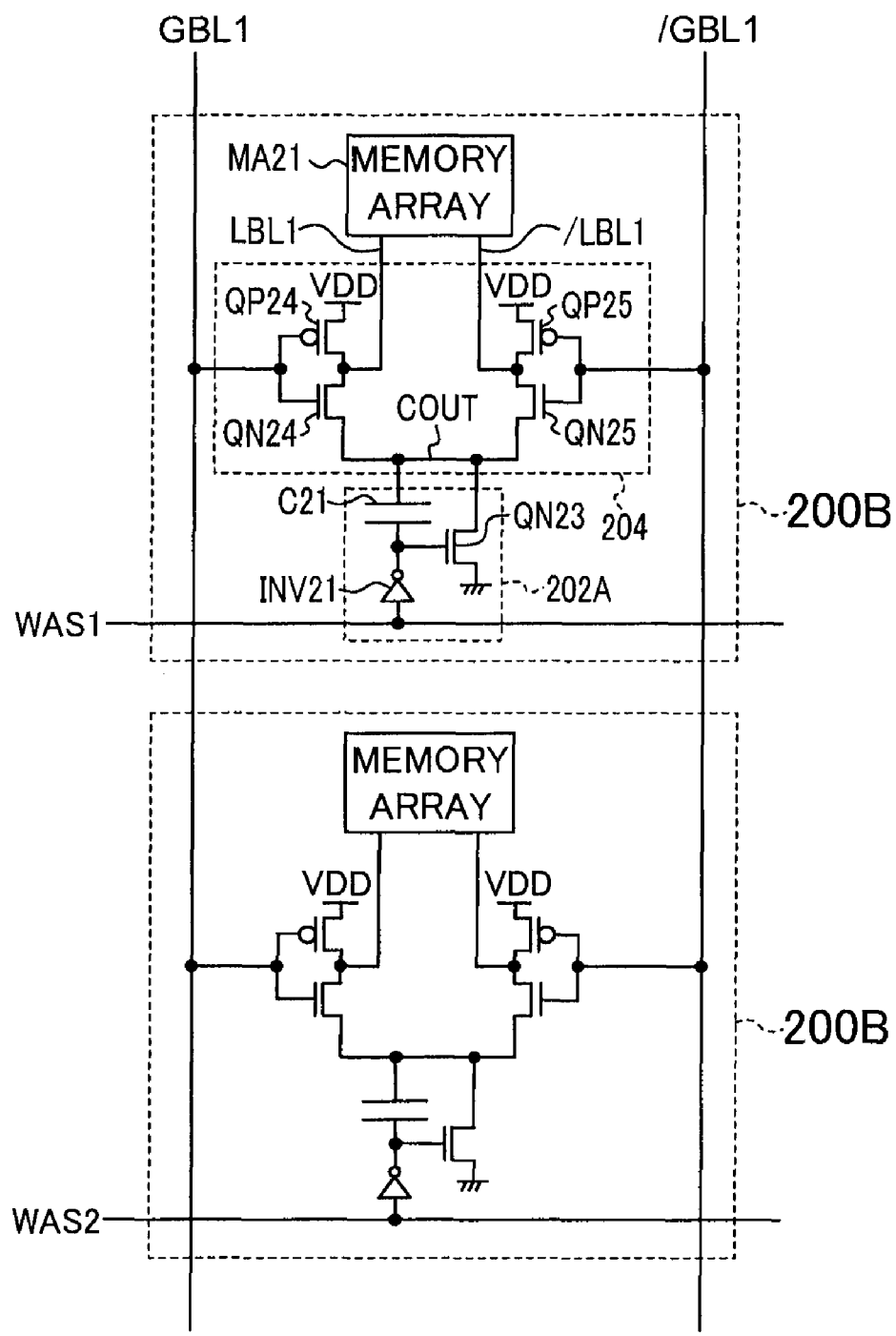
FIG. 13 is a circuit diagram showing a configuration of a semiconductor memory device according to a fourth embodiment of the present disclosure.

FIG. 13 is a diagram showing a configuration of a semiconductor memory device according to a fourth embodiment of the present disclosure. The semiconductor memory device of FIG. 13 includes a plurality of hierarchical arrays 200B. Each hierarchical array 200B includes a memory array MA21 including a plurality of memory cells, a hierarchical write circuit 202A including a capacitor C21, an NMOS transistor QN23, and an inverter INV21, and a local bit line control circuit 204 including NMOS transistors QN24 and QN25 and PMOS transistors QP24 and QP25.

Moreover, reference characters LBL1 and /LBL1 each indicate a local bit line, reference characters GBL1 and /GBL1 each indicate a global bit line, reference characters WAS1 and WAS2 each indicate a write array select signal, a reference character COUT indicates a capacitor output node, and a reference character VDD indicates a power supply.

Note that, as is different from the configuration of the third embodiment, the precharge function is imparted to the local bit line control circuit 204 in this embodiment, and therefore, the precharge control signal PCG extending across the hierarchical array 200B is no longer required.

The memory array MA21 is connected to the local bit lines LBL1 and /LBL1. Data is written to a memory cell in the memory array MA21 as follows. After a selected word line (not shown) has transitioned from low to high (active state), the potential of one of the local bit lines LBL1 and /LBL1 which have been previously precharged high transitions from high to low.

In the hierarchical write circuit 202A, the inverter INV21 is connected to the write array select signal WAS1 (WAS2). The hierarchical write circuit 202A controls write operation as follows. An output signal of the inverter INV21 is input to the gate terminal of the NMOS transistor QN23 connected between the capacitor output node COUT and a ground power supply, and to the capacitor C21 connected to the capacitor output node COUT, and each input is output to the capacitor output node COUT.

In the local bit line control circuit 204, the PMOS transistors QP24 and QP25 are connected between the power supply VDD, and the local bit lines LBL1 and /LBL1, respectively, the NMOS transistors QN24 and QN25 are connected between the ground power supply, and the local bit lines LBL1 and /LBL1, respectively, and the global bit lines GBL1 and /GBL1 are connected to the gate terminals of the PMOS transistors QP24 and QP25 and the NMOS transistors QN24 and QN25, respectively.

Operation of the semiconductor memory device of this embodiment thus configured will be described hereinafter. Firstly, when write operation is not performed, the global bit lines GBL1 and /GBL1 are both held low. Therefore, in the local bit line control circuit 204, the PMOS transistors QP24 and QP25 are on, and the local bit lines LBL1 and /LBL1 are connected to the power supply VDD and held high. The write array select signal WAS1 (WAS2) is low, and therefore, the NMOS transistor QN23 to which a high signal is input via the inverter INV21 is turned on, whereby the capacitor output node COUT is discharged low.

When write operation is performed, data is set on the global bit lines GBL1 and /GBL1 (e.g., the global bit line GBL1 is high and the global bit line /GBL1 is low), and the NMOS transistor QN24 and the PMOS transistor QP25 are turned on. As a result, the local bit line LBL1 is connected to the capacitor output node COUT which has been previously connected to the ground power supply via the NMOS transistor QN23, and therefore is discharged low. On the other hand, the local bit line /LBL1 is connected via the PMOS transistor QP25 to the power supply VDD, and therefore is held high.

Thereafter, in a selected hierarchical array 200B, the write array select signal WAS1 transitions from low to high. In this case, an inverted version (signal which has transitioned from high to low) of the write array select signal WAS1 which has been passed through the inverter INV21 is input to the NMOS transistor QN23 and the capacitor C21. As a result, the NMOS transistor QN23 is turned off, and therefore, the capacitor output node COUT and the ground power supply are disconnected. The capacitor C21 extracts electric charge from the capacitor output node COUT, the local bit line LBL1, and the memory node of a selected memory cell, so that the potentials of the local bit line LBL1 and the like which have been low are decreased to a negative potential, whereby data is written to the memory cell.

In an unselected hierarchical array 200B, the write array select signal WAS2 is held low, and the NMOS transistor QN23 to which the inverted version of the write array select signal WAS2 is input is held on, so that the local bit line LBL1 maintains connection to the ground power supply, and therefore is held low. The extraction of electric charge by the capacitor C21 does not occur, and therefore, the potential of the local bit line LBL1 is not decreased to a negative potential.

Advantages of this embodiment described above will be described hereinafter. As in the third embodiment, the scale of the hierarchical write circuit 202A is optimized, and therefore, the negative potential applied to the local bit lines LBL1 and /LBL1 can be minimized, whereby the reliability degradation can be more reduced than in the conventional art. Moreover, the removal of the precharge control signal PCG allows a reduction in area and a relaxation in the complexity of interconnection, which may lead to a reduction in noise.

Fifth Embodiment

Figure 14:
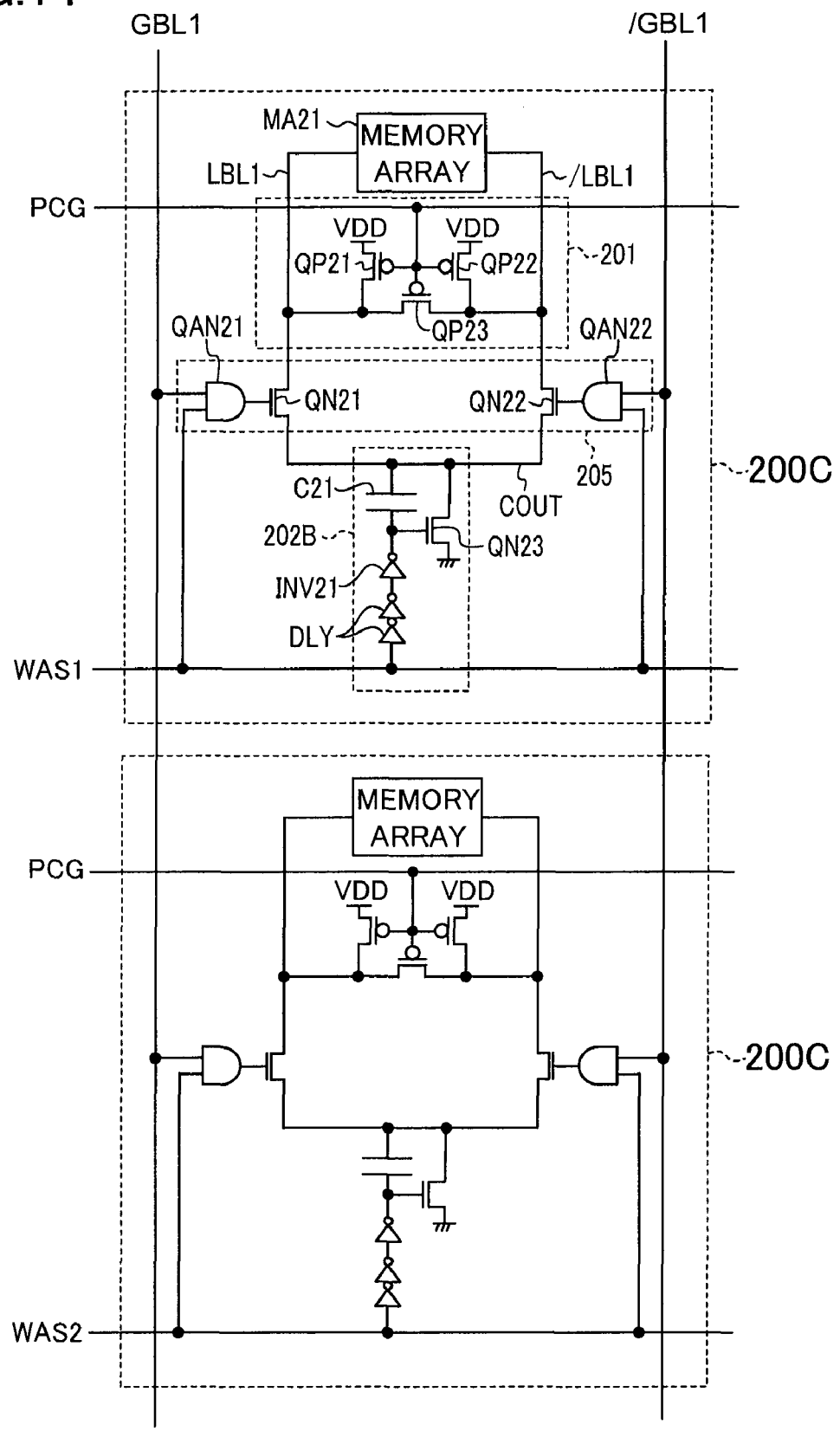
FIG. 14 is a circuit diagram showing a configuration of a semiconductor memory device according to a fifth embodiment of the present disclosure.

FIG. 14 is a diagram showing a configuration of a semiconductor memory device according to a fifth embodiment of the present disclosure. The semiconductor memory device of FIG. 14 includes a plurality of hierarchical arrays 200C. Each hierarchical array 200C includes a memory array MA21 including a plurality of memory cells, a precharge circuit 201 including PMOS transistors QP21, QP22, and QP23, an array select circuit 205 including NMOS transistors QN21 and QN22 and AND circuits QAN21 and QAN22, and a hierarchical write circuit 202B including a capacitor C21, an NMOS transistor QN23, an inverter INV21, and a delay element DLY.

Moreover, reference characters LBL1 and /LBL1 each indicate a local bit line, reference characters GBL1 and /GBL1 each indicate a global bit line, a reference character PCG indicates a precharge control signal, reference characters WAS1 and WAS2 each indicate a write array select signal, a reference character COUT indicates a capacitor output node, and a reference character VDD indicates a power supply.

The memory array MA21 is connected to the local bit lines LBL1 and /LBL1. Data is written to a memory cell in the memory array MA21 as follows. After a selected word line (not shown) has transitioned from low to high (active state), the potential of one of the local bit lines LBL1 and /LBL1 which have been previously precharged high transitions from high to low.

In the precharge circuit 201, the PMOS transistors QP21 and QP22 are connected between the power supply VDD, and the local bit lines LBL1 and /LBL1, respectively, the PMOS transistor QP23 is connected between the local bit lines LBL1 and /LBL1, and the precharge control signal PCG is connected to the gate terminals of the PMOS transistors QP21, QP22, and QP23. When the precharge control signal PCG transitions low to turn on the PMOS transistors QP21, QP22, and QP23, the precharge circuit 201 precharges the local bit lines LBL1 and /LBL1 high. When data is written to a memory cell, the precharge control signal PCG transitions high to turn off the PMOS transistors QP21, QP22, and QP23, which therefore do not affect the local bit lines LBL1 and /LBL1.

In the hierarchical write circuit 202B, the inverter INV21 is connected via the delay element DLY to the write array select signal WAS1 (WAS2). An output signal of the inverter INV21 is input to the gate terminal of the NMOS transistor QN23 connected between the capacitor output node COUT and a ground power supply, and to the capacitor C21 connected to the capacitor output node COUT, and each input is output to the capacitor output node COUT.

In the array select circuit 205, the AND circuits QAN21 and QAN22 receive signals on the global bit lines GBL1 and /GBL1, respectively, and the write array select signal WAS1 (WAS2), and output the signals to the gate terminals of the NMOS transistors QN21 and QN22, respectively, which are connected between the local bit lines LBL1 and /LBL1, respectively, and the hierarchical write circuit 202B. Thus, the array select circuit 205 controls connection and disconnection between the local bit lines LBL1 and /LBL1, and the hierarchical write circuit 202B, to select a hierarchical array 200C to which data is to be written.

Operation of the semiconductor memory device of this embodiment thus configured will be described hereinafter. Firstly, when write operation is not performed, all the write array select signals WAS1 and WAS2 are low, and therefore, the outputs of the AND circuits QAN21 and QAN22 are invariably low, so that the NMOS transistors QN21 and QN22 are turned off, and therefore, the local bit lines LBL1 and /LBL1 and the hierarchical write circuit 202B are disconnected. Also, the precharge control signal PCG is low, and therefore, the precharge circuit 201 controlled in accordance with the precharge control signal PCG is activated, so that the local bit lines LBL1 and /LBL1 are precharged high.

Next, a hierarchical array 200C which is selected when write operation is performed will be described. In this case, the precharge control signal PCG transitions high, so that the precharge circuit 201 is inactivated. Thereafter, data is set on the global bit lines GBL1 and /GBL1 (e.g., the global bit line GBL1 is high and the global bit line /GBL1 is low), and thereafter, the write array select signal WAS1 transitions from low to high. As a result, the AND circuit QAN21 which receives the signal on the global bit line GBL1 and the write array select signal WAS1 is activated. On the other hand, the AND circuit QAN22 which receives the signal on the global bit line /GBL1 and the write array select signal WAS1 is maintained inactive. By the activation of the AND circuit QAN21, the local bit line LBL1 is connected to the hierarchical write circuit 202B, so that the local bit line LBL1 is connected to the capacitor output node COUT which has been previously connected via the NMOS transistor QN23 to the ground power supply, and therefore is discharged low. After the delay element DLY delays the local bit line LBL1 by a specific time from the discharging, an inverted version (signal which has transitioned from high to low) of the write array select signal WAS1 which has been passed through the inverter INV21 is input to the NMOS transistor QN23 and the capacitor C21. As a result, the NMOS transistor QN23 is turned off, and therefore, the capacitor output node COUT and the ground power supply are disconnected. The capacitor C21 extracts electric charge from the capacitor output node COUT, the local bit line LBL1, and the memory node of a selected memory cell, so that the potentials of a local bit line LBL1 and the like are decreased to a negative potential, whereby data is written to the memory cell.

On the other hand, in an unselected hierarchical array 200C when write operation is performed, the AND circuits QAN21 and QAN22 receive the write array select signal WAS2 which is low, and therefore are inactivated, so that the local bit lines LBL1 and /LBL1 are disconnected from the hierarchical write circuit 202B. Therefore, as is different from the selected hierarchical array 200C, the potentials of the local bit lines LBL1 and /LBL1 are not decreased to the low level or a negative potential. Specifically, in the unselected hierarchical array 200C, charging and discharging of the local bit lines LBL1 and /LBL1 which are performed by write operation and precharging are not performed.

Advantages of this embodiment described above will be described hereinafter. Specifically, in an unselected hierarchical array 200C, the potentials of the local bit lines LBL1 and /LBL1 are not decreased to a negative potential. Also, in a selected hierarchical array 200C, the scale of the hierarchical write circuit 202B is optimized, whereby the negative potential applied to the local bit lines LBL1 and /LBL1 can be minimized, and therefore, as in the third embodiment, the reliability degradation can be more reduced than in the conventional art. Moreover, when write operation is performed, in an unselected hierarchical array 200C, charging and discharging of the local bit lines LBL1 and /LBL1 are not performed, and therefore, power consumption can be reduced.

Figure 15:
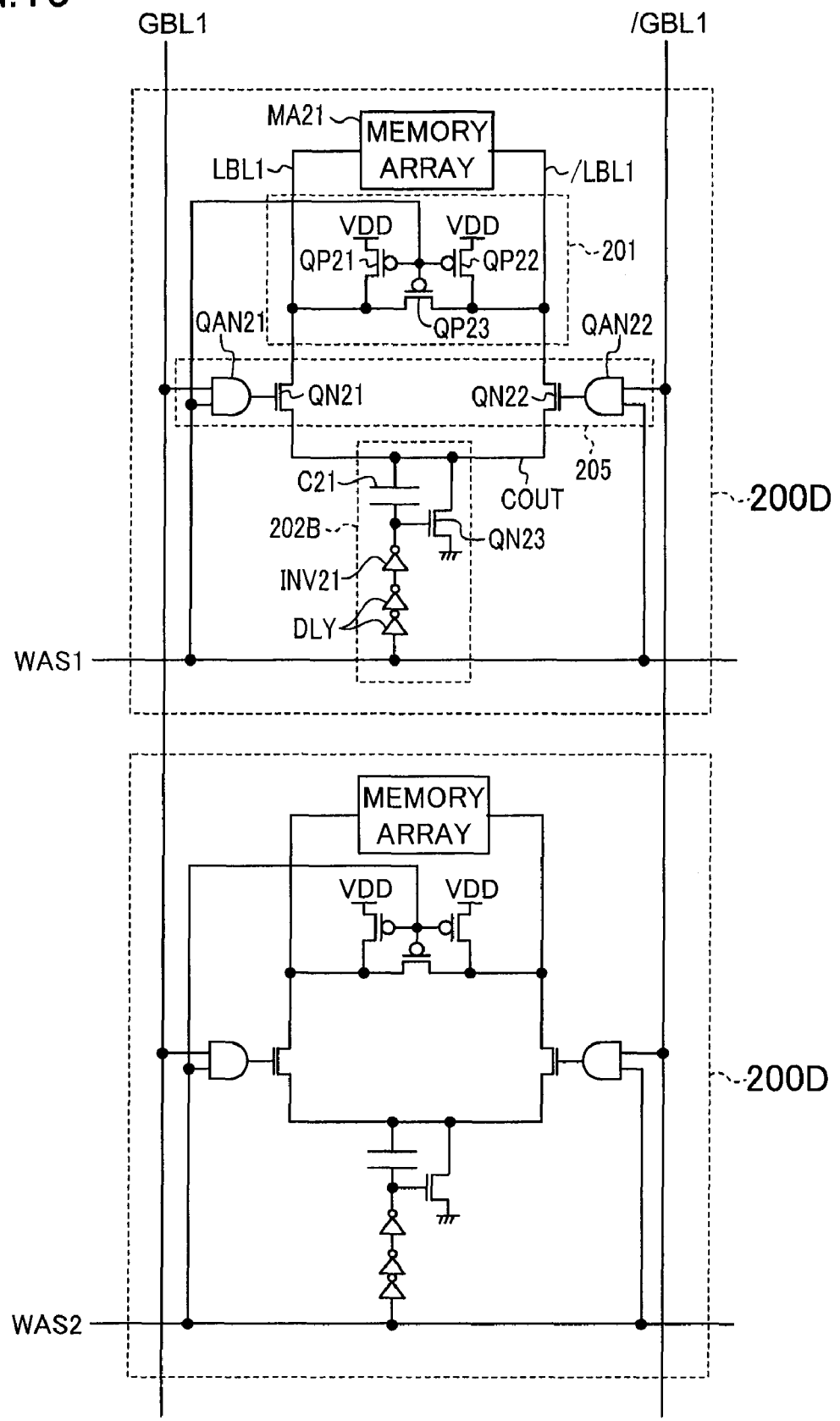
FIG. 15 is a circuit diagram showing another example configuration of the semiconductor memory device of the fifth embodiment.

FIG. 15 is a diagram showing another example of the hierarchical array 200C of FIG. 14. In the hierarchical array 200D of FIG. 15, the write array select signal WAS1 (WAS2) is connected to the gate terminals of the PMOS transistors QP21, QP22, and QP23 of the precharge circuit 201 so that the write array select signal WAS1 (WAS2) of the hierarchical array 200C of FIG. 14 can also be used to control precharging of the local bit lines LBL1 and /LBL1. As a result, the precharge control signal PCG can be removed, resulting in a reduction in area and a relaxation in the complexity of interconnection, which may lead to a reduction in noise.

Sixth Embodiment

Figure 16:
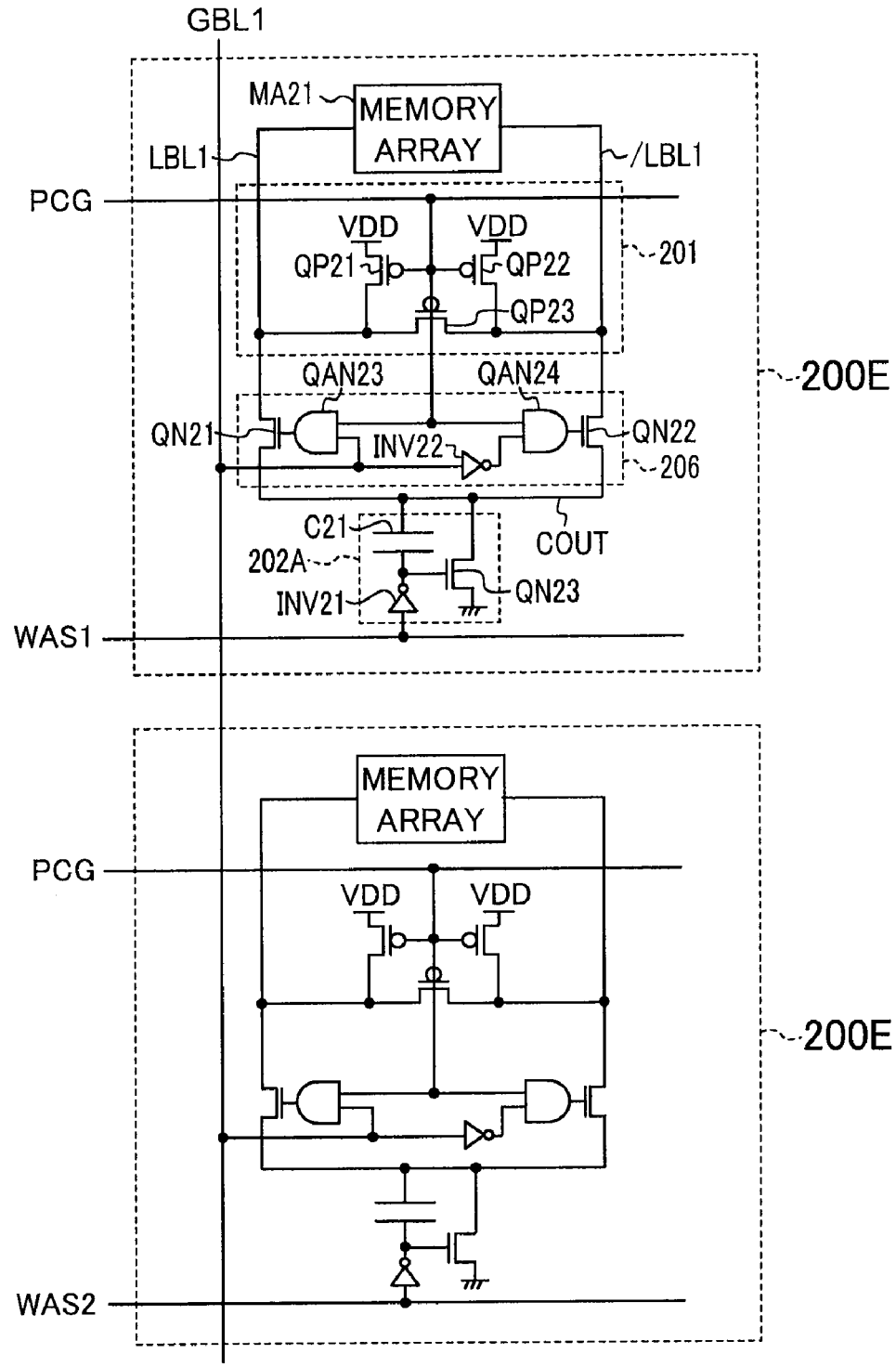
FIG. 16 is a circuit diagram showing a configuration of a semiconductor memory device according to a sixth embodiment of the present disclosure.

FIG. 16 is a diagram showing a configuration of a semiconductor memory device according to a sixth embodiment of the present disclosure. The semiconductor memory device of FIG. 16 includes a plurality of hierarchical arrays 200E. Each hierarchical array 200E includes a memory array MA21 including a plurality of memory cells, a precharge circuit 201 including PMOS transistors QP21, QP22, and QP23, a hierarchical write circuit 202A including a capacitor C21, an NMOS transistor QN23, and an inverter INV21, and a local bit line select circuit 206 including AND circuits QAN23 and QAN24, an inverter INV22, and NMOS transistors QN21 and QN22.

Moreover, reference characters LBL1 and /LBL1 each indicate a local bit line, a reference character GBL1 indicates a global bit line, a reference character PCG indicates a precharge control signal, reference characters WAS1 and WAS2 each indicate a write array select signal, a reference character COUT indicates a capacitor output node, and a reference character VDD indicates a power supply.

The memory array MA21 is connected to the local bit lines LBL1 and /LBL1. Data is written to a memory cell in the memory array MA21 as follows. After a selected word line (not shown) has transitioned from low to high (active state), the potential of one of the local bit lines LBL1 and /LBL1 which have been previously precharged high transitions from high to low.

In the precharge circuit 201, the PMOS transistors QP21 and QP22 are connected between the power supply VDD, and the local bit lines LBL1 and /LBL1, respectively, the PMOS transistor QP23 is connected between the local bit lines LBL1 and /LBL1, and the precharge control signal PCG is connected to the gate terminals of the PMOS transistors QP21, QP22, and QP23. When the precharge control signal PCG transitions low to turn on the PMOS transistors QP21, QP22, and QP23, the precharge circuit 201 precharges the local bit lines LBL1 and /LBL1 high. When data is written to a memory cell, the precharge control signal PCG transitions high to turn off the PMOS transistors QP21, QP22, and QP23, which therefore do not affect the local bit lines LBL1 and /LBL1.

In the hierarchical write circuit 202A, the inverter INV21 is connected to the write array select signal WAS1 (WAS2). The hierarchical write circuit 202A controls write operation as follows. An output signal of the inverter INV21 is input to the gate terminal of the NMOS transistor QN23 connected between the capacitor output node COUT and a ground power supply, and to the capacitor C21 connected to the capacitor output node COUT, and each input is output to the capacitor output node COUT.

The local bit line select circuit 206 has a configuration described as follows. The AND circuit QAN23 receives the precharge control signal PCG and a signal on the global bit line GBL1. The AND circuit QAN24 receives the precharge control signal PCG and the inverted version of the signal on the global bit line GBL1. The NMOS transistors QN21 and QN22 receives output signals of the AND circuits QAN23 and QAN24, respectively, and connect and disconnect between the local bit lines LBL1 and /LBL1, respectively, and the capacitor output node COUT.

Operation of the semiconductor memory device of this embodiment thus configured will be described hereinafter. Firstly, when write operation is not performed, the global bit line GBL1 is held low, and the precharge control signal PCG is held low. As a result, the AND circuits QAN23 and QAN24 are inactivated, so that the NMOS transistors QN21 and QN22 are turned off, whereby the local bit lines LBL1 and /LBL1 and the hierarchical write circuit 202A are disconnected. On the other hand, the precharge circuit 201 is activated, and the local bit lines LBL1 and /LBL1 are precharged. The write array select signal WAS1 (WAS2) is low, and therefore, the NMOS transistor QN23 to which a high signal is input via the inverter INV21 is turned on, so that the capacitor output node COUT is discharged low.

When write operation is performed, the precharge control signal PCG transitions high, so that the precharge circuit 201 is inactivated. Thereafter, data is set on the global bit line GBL1 (e.g., the global bit line GBL1 is high). In this case, the AND circuit QAN23 outputs a high signal to the NMOS transistor QN21, which is then turned on. As a result, the local bit line LBL1 is connected to the capacitor output node COUT which has been previously connected via the NMOS transistor QN23 to the ground power supply, and therefore is discharged low. On the other hand, the AND circuit QAN24 outputs a low signal to the NMOS transistor QN22, and therefore, the NMOS transistor QN22 is held off, so that the local bit line /LBL1 and the hierarchical write circuit 202A remain disconnected.

Thereafter, in a selected hierarchical array 200E, the write array select signal WAS1 transitions form low to high. In this case, an inverted version (signal which has transitioned from high to low) of the write array select signal WAS1 which has been passed through the inverter INV21 is input to the NMOS transistor QN23 and the capacitor C21. As a result, the NMOS transistor QN23 is turned off, and therefore, the capacitor output node COUT and the ground power supply are disconnected. The capacitor C21 extracts electric charge from the capacitor output node COUT, the local bit line LBL1, and the memory node of a selected memory cell, so that the potentials of a local bit line and the like are decreased to a negative potential, whereby data is written to the memory cell.

In an unselected hierarchical array 200E, the write array select signal WAS2 is held low, and the NMOS transistor QN23 to which the inverted version of the write array select signal WAS2 is input is held on, so that the local bit line LBL1 maintains connection to the ground power supply, and therefore is held low. The extraction of electric charge by the capacitor C21 does not occur, and therefore, the potential of the local bit line LBL1 is not decreased to a negative potential.

Advantages of this embodiment described above will be described hereinafter. Specifically, in an unselected hierarchical array 200E, the potentials of the local bit lines LBL1 and /LBL1 are not decreased to a negative potential. Also, in a selected hierarchical array 200E, the scale of the hierarchical write circuit 202A is optimized, whereby the negative potential applied to the local bit lines LBL1 and /LBL1 can be minimized, and therefore, as in the third embodiment, the reliability degradation can be more reduced than in the conventional art. Moreover, the reduction of the global bit lines allows a reduction in area and a relaxation in the complexity of interconnection, which may lead to a reduction in noise.

Figure 17:
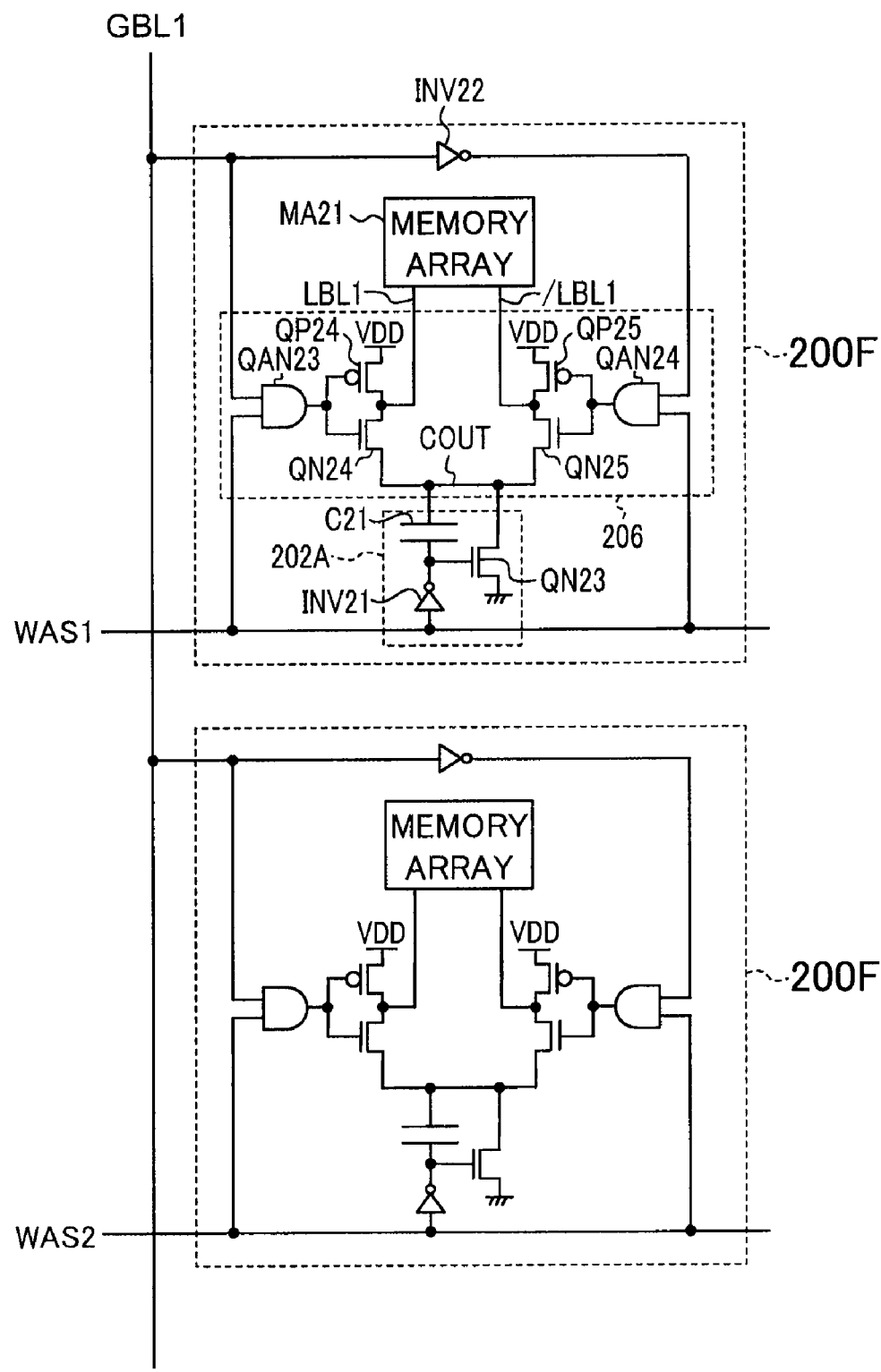
FIG. 17 is a circuit diagram showing another example configuration of the semiconductor memory device of the sixth embodiment.

FIG. 17 is a diagram showing another example of the hierarchical array 200E of FIG. 16. In the hierarchical array 200F of FIG. 17, the local bit line select circuit 206 including the NMOS transistors QN24 and QN25, the PMOS transistors QP24 and QP25, and the AND circuits QAN23 and QAN24 is provided so that the write array select signal WAS1 (WAS2) of the hierarchical array 200E of FIG. 16 can also be used to control precharging of the local bit lines LBL1 and /LBL1. The AND circuit QAN23 receives the write array select signal WAS1 (WAS2) and a signal on the global bit line GBL1, while the AND circuit QAN24 receives the write array select signal WAS1 (WAS2) and the inverted version of the signal on the global bit line GBL1. The conduction of each of the NMOS transistors QN24 and QN25 and the PMOS transistors QP24 and QP25 is controlled in accordance with output signals of the AND circuits QAN23 and QAN24. As a result, the precharge control signal PCG can be removed, resulting in a reduction in area and a relaxation in the complexity of interconnection, which may lead to a reduction in noise.

Seventh Embodiment

Figure 18:
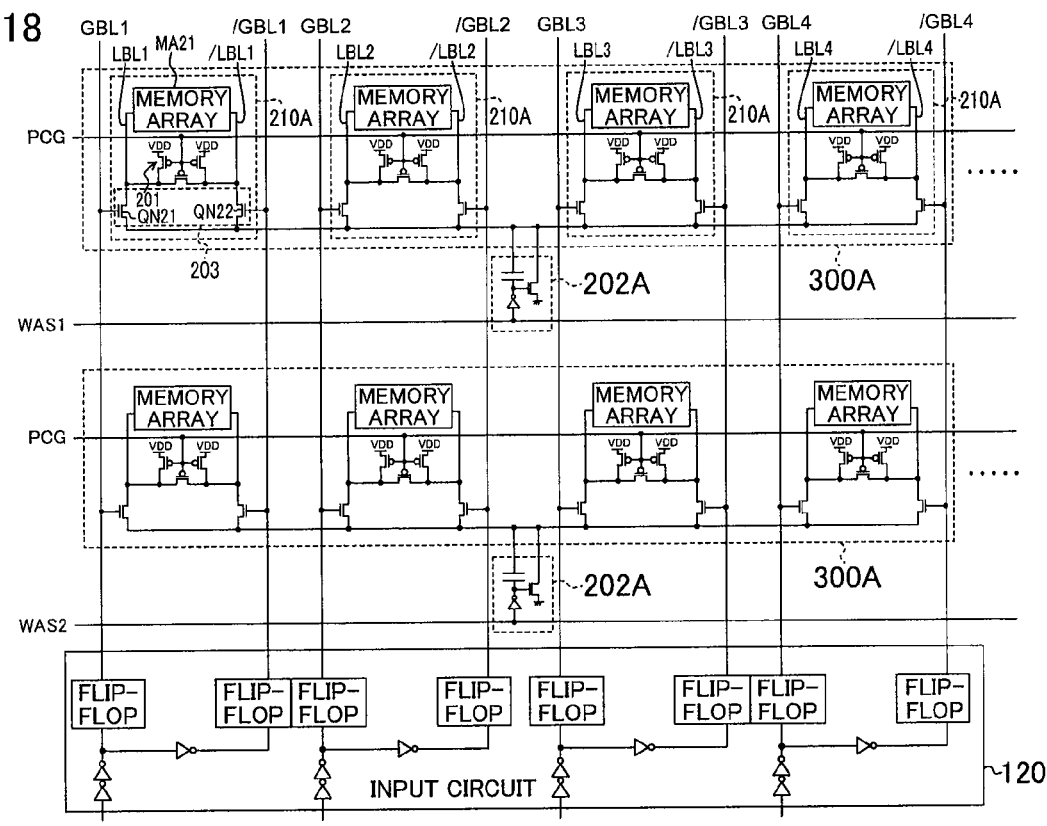
FIG. 18 is a circuit diagram showing a configuration of a semiconductor memory device according to a seventh embodiment of the present disclosure.

FIG. 18 is a diagram showing a configuration of a semiconductor memory device according to a seventh embodiment of the present disclosure. The semiconductor memory device of FIG. 18 includes a plurality of hierarchical arrays 210A, a plurality of hierarchical write circuits 202A, and a plurality of input circuits 120. Each hierarchical array 210A includes a memory array MA21 including a plurality of memory cells, a precharge circuit 201, and a local bit line select switch 203 including NMOS transistors QN21 and QN22. Reference characters LBL1-LBL4 and /LBL1-/LBL4 each indicate a local bit line, reference characters GBL1-GBL4 and /GBL1-/GBL4 each indicate a global bit line, a reference character PCG indicates a precharge control signal, reference characters WAS1 and WAS2 each indicate a write array select signal, and a reference character VDD indicates a power supply. In this case, only one hierarchical write circuit 202A is connected to each of groups 300A of hierarchical arrays 210A which receives data from a single corresponding input circuit 120 and is selected in accordance with a single corresponding write array select signal WAS1 (WAS2).

Only one of the global bit lines GBL1-GBL4 and /GBL1-/GBL4 connected to a single input circuit 120 is selected (transitions high) when write operation is performed. Therefore, for example, when the global bit line GBL1 transitions high, only the NMOS transistor QN21 whose gate receives a signal on the global bit line GBL1 is turned on, so that only the local bit line LBL1 of a hierarchical array 210A connected to the global bit line GBL1 is connected to the hierarchical write circuit 202A. In other words, in a hierarchical array group 300A which receives data from a single corresponding input circuit 120 and is controlled in accordance with a single corresponding write array select signal WAS1 (WAS2), only one of the local bit lines LBL1-LBL4 and /LBL1-/LBL4 is invariably connected to the hierarchical write circuit 202A. As a result, even if the number of columns connected to the hierarchical write circuit 202A is increased, then when only a single input circuit 120 inputs data to those columns, the overall capacitance of targets whose voltages are to be decreased by the hierarchical write circuit 202A is substantially constant. Therefore, for example, when four pairs of global bit lines GBL1-GBL4 and /GBL1-/GBL4 are connected to a single input circuit 120, only one hierarchical write circuit 202A may be provided for each hierarchical array group 300A which receives data from a single corresponding input circuit 120, and includes four neighboring hierarchical arrays 210A which are controlled in accordance with a single corresponding write array select signal WAS1 (WAS2). The reduction in the number of the hierarchical write circuits 202A allows a reduction in area.

Eighth Embodiment

Figure 19:
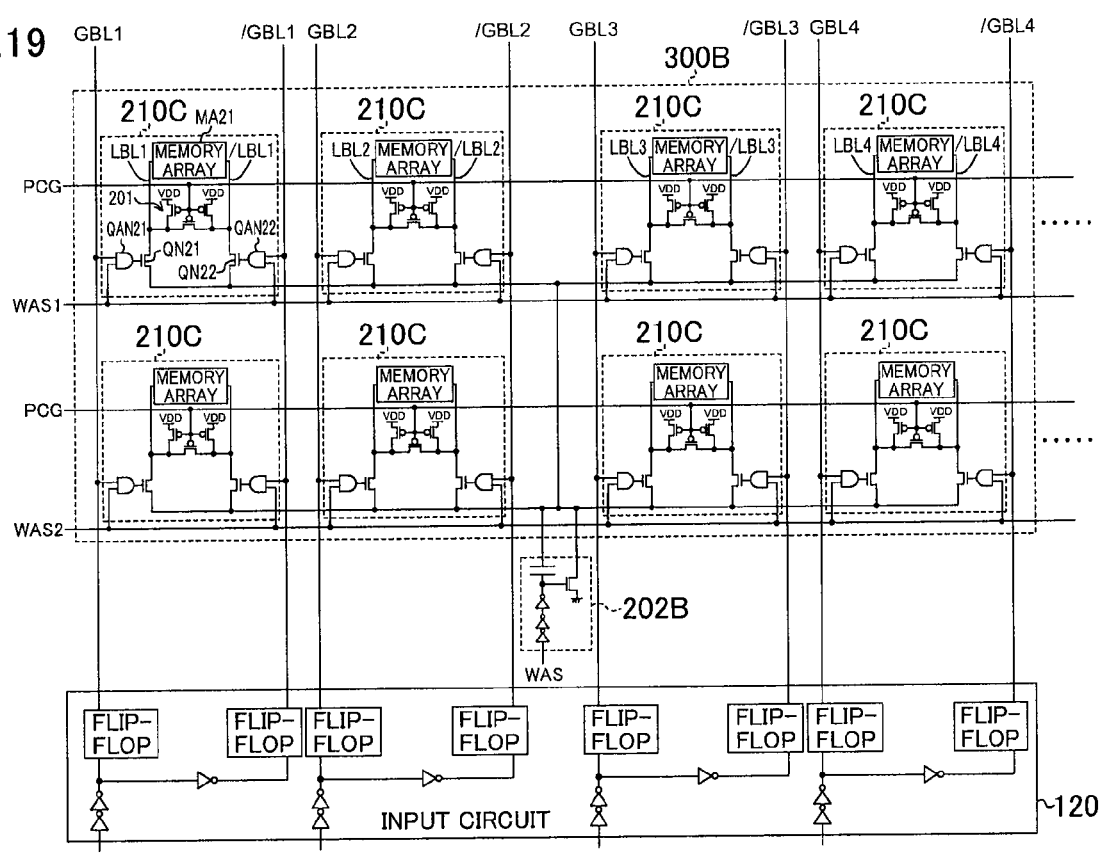
FIG. 19 is a circuit diagram showing a configuration of a semiconductor memory device according to an eighth embodiment of the present disclosure.

FIG. 19 is a diagram showing a configuration of a semiconductor memory device according to an eighth embodiment of the present disclosure. The semiconductor memory device of FIG. 19 includes a plurality of hierarchical arrays 210C, a plurality of hierarchical write circuit 202B, and a plurality of input circuits 120. Each hierarchical array 210C includes a memory array MA21 including a plurality of memory cells, a precharge circuit 201, and an array select circuit including NMOS transistors QN21 and QN22 and AND circuits QAN21 and QAN22. Reference characters LBL1-LBL4 and /LBL1-/LBL4 each indicate a local bit line, reference characters GBL1-GBL4 and /GBL1-/GBL4 each indicate a global bit line, a reference character PCG indicates a precharge control signal, reference characters WAS1 and WAS2 each indicate a write array select signal, and a reference character VDD indicates a power supply. Only one hierarchical write circuit 202B is provided for each input circuit 120.

Only one of the global bit lines GBL1-GBL4 and /GBL1-/GBL4 connected to a single input circuit 120 is selected (transitions high) when write operation is performed. Also, only one of the write array select signals WAS1 and WAS2 is selected (transitions high) when write operation is performed. Therefore, for each input circuit 120, it is only one hierarchical array 210C that is selected by its own AND circuits QAN21 and QAN22 which receive signals on the corresponding global bit lines (GBL1-GBL4, /GBL1-/GBL4) and the corresponding write array select signal (WAS1, WAS2) and calculates the logical AND of the received signals. In this case, only the local bit line LBL1 (/LBL1) of the selected hierarchical array 210C is connected via the NMOS transistor QN21 (QN22) to the hierarchical write circuit 202B. In other words, in a hierarchical array group 300B which receives data from a single corresponding input circuit 120, only one of the local bit lines LBL1-LBL4 and /LBL1-/LBL4 is invariably connected to the hierarchical write circuit 202B. As a result, even if the number of global bit lines connected to the hierarchical write circuit 202B is increased, the overall capacitance of targets whose voltages are to be decreased by the hierarchical write circuit 202B is substantially constant. Therefore, for example, only one hierarchical write circuit 202B may be provided for each input circuit 120. The reduction in the number of the hierarchical write circuits 202B allows a reduction in area.

Ninth Embodiment

Figure 20:
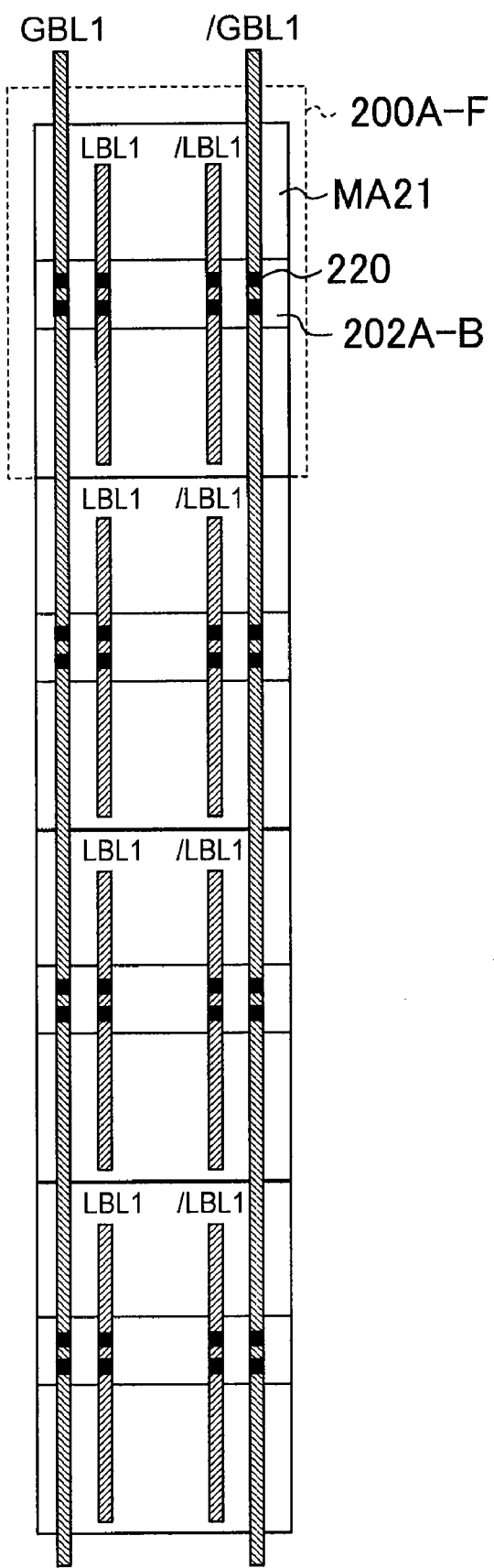
FIG. 20 is a diagram showing a layout of a semiconductor memory device according to a ninth embodiment of the present disclosure.

FIG. 20 is a diagram showing a layout of a semiconductor memory device according to a ninth embodiment of the present disclosure. In the layout diagram of the semiconductor memory device of FIG. 20, the local bit line LBL1 (/LBL1) is extended on opposite sides of the hierarchical write circuit 202A or 202B in each of the hierarchical arrays 200A-200F. Specifically, in each of the hierarchical arrays 200A-200F, memory arrays MA21 are provided on the opposite sides of the hierarchical write circuit 202A or 202B, and are connected to the common local bit line LBL1 (/LBL1) which is connected to the hierarchical write circuit 202A or 202B via a contact 220. Therefore, the same data can be simultaneously transmitted to the opposite sides. As a result, compared to when the hierarchical write circuit 202A or 202B is provided on only one side of each memory array MA21, the signal transmission distance can be reduced by a half, resulting in higher-speed write operation.

Tenth Embodiment

Figure 21:
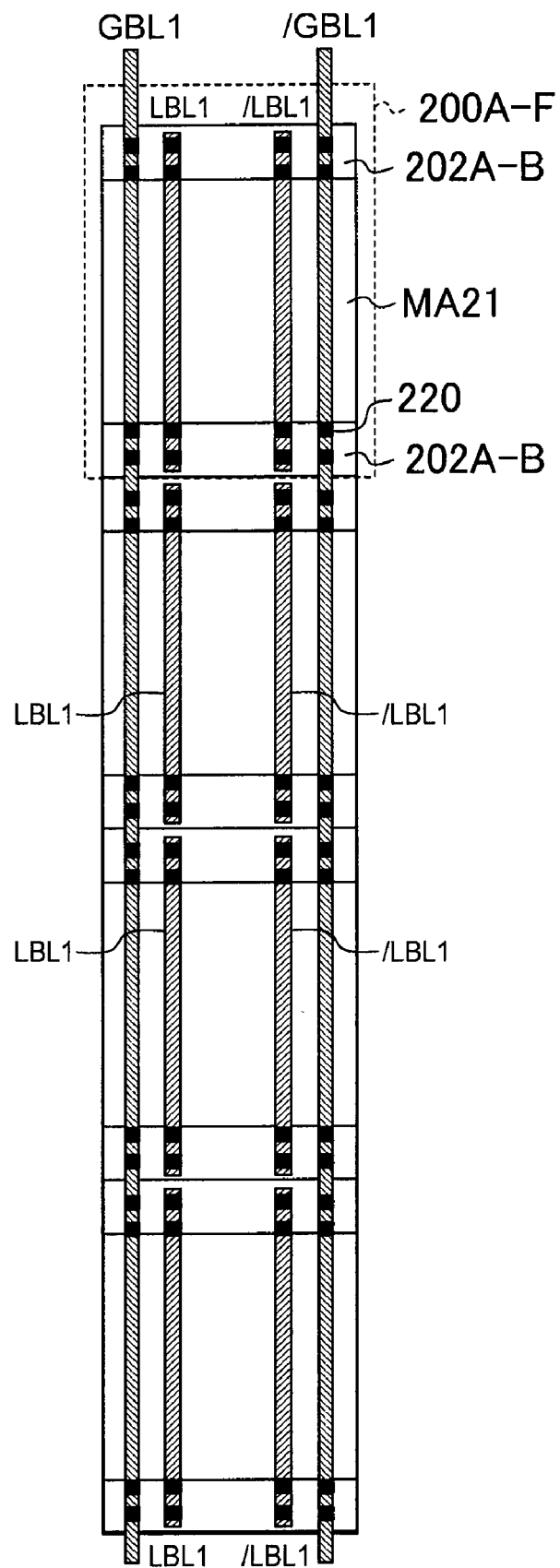
FIG. 21 is a diagram showing a layout of a semiconductor memory device according to a tenth embodiment of the present disclosure.

FIG. 21 is a diagram showing a layout of a semiconductor memory device according to a tenth embodiment of the present disclosure. In the layout diagram of the semiconductor memory device of FIG. 21, the hierarchical write circuit 202A or 202B is provided at opposite ends of the local bit line LBL1 (/LBL1) and is connected to the local bit line LBL1 (/LBL1) via a contact 220 in each of the hierarchical arrays 200A-200F. In other words, in the layout of each of the hierarchical arrays 200A-200F, the hierarchical write circuit 202A or 202B is provided at opposite ends of each memory array MA21, and the device size of the hierarchical write circuit 202A or 202B is about ½ of the hierarchical write circuit 202A or 202B of the ninth embodiment. In such an arrangement, the same data is transmitted from the hierarchical write circuit 202A or 202B at the opposite ends to the memory array MA21. Therefore, compared to when the hierarchical write circuit 202A or 202B is provided on only one side of the memory array MA21, the signal transmission distance is reduced by a half, resulting in higher-speed write operation.

Eleventh Embodiment

Figure 22:
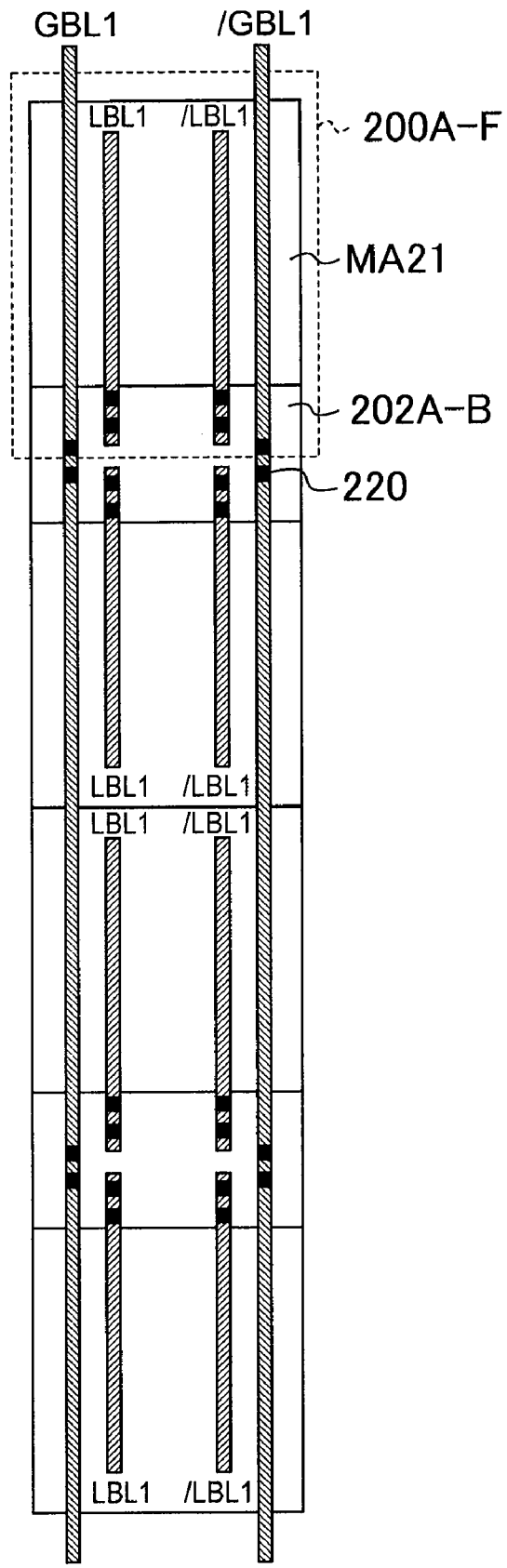
FIG. 22 is a diagram showing a layout of a semiconductor memory device according to an eleventh embodiment of the present disclosure.

FIG. 22 is a diagram showing a layout of a semiconductor memory device according to an eleventh embodiment of the present disclosure. In the layout diagram of the semiconductor memory device of FIG. 22, the hierarchical write circuit 202A or 202B is provided at one end of the local bit line LBL1 (/LBL1) in the layout of each of the hierarchical arrays 200A-200F. In other words, in the layout of each of the hierarchical arrays 200A-200F, the hierarchical write circuit 202A or 202B is provided at one end, and therefore can be shared by adjacent hierarchical arrays (200A-200F). When the hierarchical write circuit 202A or 202B is shared by adjacent hierarchical arrays (200A-200F), the device size of the hierarchical write circuit 202A or 202B is about two times as large as that of the hierarchical write circuit 202A or 202B of the ninth embodiment. In such an arrangement, the layout efficiency can be improved by, for example, a reduction in isolation regions which is achieved by device sharing, resulting in a reduction in area.

Note that the variable capacitor C11 described in the first embodiment can be used as the capacitor C21 in the hierarchical write circuit 202A or 202B of the fourth to eighth embodiments.

As described above, the semiconductor memory device of the present disclosure can reduce or prevent the reliability degradation of each element while improving the characteristic of data write operation to a memory cell at a low power supply voltage, and therefore is useful for static random access memories (SRAMs) and the like.

What is claimed is:

1. A semiconductor memory device comprising:
a first word line;
a pair of first bit lines;
a first memory cell connected to the first word line and the pair of first bit lines;
a first select circuit configured to select one of the pair of first bit lines; and
a write circuit connected via the first select circuit to the pair of first bit lines, wherein
the write circuit includes
a first control circuit configured to control a potential of the one selected by the first select circuit of the pair of first bit lines to a first potential, and
a variable capacitance capacitor configured to control the potential of the selected bit line to a second potential which is lower than the first potential, and
the second potential is adjusted by a capacitance of the variable capacitance capacitor being changed, depending on a voltage applied to the variable capacitance capacitor.

2. The semiconductor memory device of claim 1, wherein the potential of the one selected by the first select circuit of the pair of first bit lines is decreased by the first control circuit before being controlled to the second potential by the variable capacitance capacitor.

3. The semiconductor memory device of claim 1, wherein the variable capacitance capacitor is an N-type DMOS transistor, and
the N-type DMOS transistor has a gate connected via the first select circuit to the pair of first bit lines, and a source and a drain to which a common variable voltage is applied.

4. The semiconductor memory device of claim 1, wherein the variable capacitance capacitor is a P-type DMOS transistor, and the P-type DMOS transistor has a source and a drain connected via the first select circuit to the pair of first bit lines, and a gate to which a variable voltage is applied.

5. The semiconductor memory device of claim 1, wherein
the variable capacitance capacitor is an N-type DMOS transistor or a P-type DMOS transistor, and
the N-type DMOS transistor or the P-type DMOS transistor includes an oxide film having a thickness equal to that of an oxide film of an IO transistor of an LSI provided in the semiconductor memory device.

6. The semiconductor memory device of claim 1, further comprising:
a constant capacitance capacitor,
wherein
the variable capacitance capacitor is an N-type DMOS transistor or a P-type DMOS transistor, and
the constant capacitance capacitor is connected in parallel to the N-type DMOS transistor or the P-type DMOS transistor.

7. The semiconductor memory device of claim 1, further comprising:
a second word line;
a pair of second bit lines;
a second memory cell connected to the second word line and the pair of second bit lines; and
a second select circuit configured to select one of the pair of second bit lines,
wherein
the write circuit is connected via the second select circuit to the pair of second bit lines.

8. The semiconductor memory device of claim 7, further comprising:
an input circuit,
wherein
the write circuit is provided adjacent to the input circuit.

9. A semiconductor memory device comprising:
a first word line;
a pair of first bit lines;
a first memory cell connected to the first word line and the pair of first bit lines;
a first select circuit configured to select one of the pair of first bit lines;
a write circuit connected via the first select circuit to the pair of first bit lines; and
a power supply voltage detector configured to detect whether or not a power supply voltage is higher than or equal to a predetermined voltage value,
wherein
the write circuit includes
a first control circuit configured to control a potential of the one selected by the first select circuit of the pair of first bit lines to a first potential,
a second control circuit configured to control the potential of the selected bit line to a second potential which is lower than the first potential, and
a third control circuit configured to be controlled to a third potential in accordance with an output signal of the power supply voltage detector, and
the second control circuit and the third control circuit are connected in parallel to each other.

10. The semiconductor memory device of claim 9, wherein
the third control circuit controls the potential of the one selected by the first select circuit of the pair of first bit lines to the third potential which is higher than the second potential.

11. The semiconductor memory device of claim 9, further comprising:

a second word line;
a pair of second bit lines;
a second memory cell connected to the second word line and the pair of second bit lines; and
a second select circuit configured to select one of the pair of second bit lines,
wherein
the write circuit is also connected via the second select circuit to the pair of second bit lines.

12. The semiconductor memory device of claim 11, further comprising:
an input circuit,
wherein
the write circuit is provided adjacent to the input circuit.

13. A semiconductor memory device comprising:
a pair of global bit lines;
a precharge control signal;
at least one hierarchical array connected to the pair of global bit lines and the precharge control signal; and
a write array select signal configured to select one of the at least one hierarchical array to which write operation is to be performed,
wherein
each of the at least one hierarchical array includes
a pair of local bit lines,
a memory array connected to the pair of local bit lines,
a precharge circuit connected to the precharge control signal and the pair of local bit lines,
a local bit line select switch configured to select one of the pair of local bit lines, and
a hierarchical write circuit, and
the hierarchical write circuit is connected to the write array select signal, and includes a first control circuit including a transistor element, and a second control circuit including a capacitor.

14. The semiconductor memory device of claim 13, wherein
in the one of the at least one hierarchical array selected in accordance with the write array select signal, the local bit line select switch receives signals on the pair of global bit lines and selects one of the pair of local bit lines, and the first control circuit controls a potential of the selected local bit line to a first potential, and thereafter, the second control circuit controls the potential of the selected local bit line to a second potential which is lower than the first potential.

15. The semiconductor memory device of claim 13, further comprising:
an array select circuit configured to receive the write array select signal and the signals on the pair of global bit lines, and selects one of the at least one hierarchical array to which write operation is to be performed.

16. The semiconductor memory device of claim 15, wherein
the write array select signal also serves as the precharge control signal.

17. The semiconductor memory device of claim 13, wherein
the pair of global bit lines are replaced with a single global bit line.

18. The semiconductor memory device of claim 17, further comprising:
a local bit line select switch configured to be controlled in accordance with the precharge control signal or the write array select signal, and a signal on the single global bit line.

19. The semiconductor memory device of claim 13, further comprising:
a plurality of input circuits,
wherein
a first group of ones of the at least one hierarchical array is connected to at least one of the plurality of input circuits and is controlled in accordance with the single write array select signal, and
the hierarchical write circuit is connected to the first hierarchical array group.

20. The semiconductor memory device of claim 19, wherein
a second group of ones of the at least one hierarchical array is connected to at least one of the plurality of input circuits, and
the hierarchical write circuit is connected to the second hierarchical array group.

21. The semiconductor memory device of claim 20, wherein
the hierarchical write circuit is provided adjacent to the plurality of input circuits.

22. The semiconductor memory device of claim 13, wherein
the hierarchical write circuit includes a delay element, and after the first control circuit drives the pair of local bit lines, the second control circuit drives the pair of local bit lines.

23. The semiconductor memory device of claim 13, wherein
a variable capacitance capacitor is used as the second control circuit.

24. The semiconductor memory device of claim 13, wherein
in a layout of each of the at least one hierarchical array, a middle of each of the pair of local bit lines is connected to the hierarchical write circuit.

25. The semiconductor memory device of claim 13, wherein
in a layout of each of the at least one hierarchical array, opposite ends of each of the pair of local bit lines are connected to the hierarchical write circuit.

26. The semiconductor memory device of claim 13, wherein
in a layout of each of the at least one hierarchical array, one end of each of the pair of local bit lines is connected to the hierarchical write circuit.

27. A semiconductor memory device comprising:
a pair of global bit lines;
at least one hierarchical array connected to the pair of global bit lines; and
a write array select signal configured to select one of the at least one hierarchical array to which write operation is to be performed,
wherein
each of the at least one hierarchical array includes
a pair of local bit lines,
a memory array connected to the pair of local bit lines,
a local bit line control circuit configured to control the pair of local bit lines, and
a hierarchical write circuit, and
the hierarchical write circuit is connected to the write array select signal, and includes a first control circuit including a transistor element, and a second control circuit including a capacitor.

28. The semiconductor memory device of claim 27, wherein
in the one of the at least one hierarchical array selected in accordance with the write array select signal, the local bit line control circuit receives signals on the pair of global bit lines, and controls whether to maintain the pair of local bit lines high or connect one of the pair of local bit lines to the hierarchical write circuit, and the first control circuit controls a potential of the one of the pair of local bit lines connected to the hierarchical write circuit to a first potential, and therefore, the second control circuit controls the potential of the one of the pair of local bit lines connected to the hierarchical write circuit to a second potential which is lower than the first potential.

29. The semiconductor memory device of claim 27, further comprising:
an array select circuit configured to receive the write array select signal and signals on the pair of global bit lines, and select one of the at least one hierarchical arrays to which write operation is to be performed.

30. The semiconductor memory device of claim 27, wherein
the pair of global bit lines are replaced with a single global bit line.

31. The semiconductor memory device of claim 30, further comprising:
a local bit line control circuit configured to be controlled in accordance with the write array select signal and a signal on the single global bit line.

32. The semiconductor memory device of claim 27, further comprising:
a plurality of input circuits,
wherein
a first group of ones of the at least one hierarchical array is connected to at least one of the plurality of input circuits and is controlled in accordance with the single write array select signal, and
the hierarchical write circuit is connected to the first hierarchical array group.

33. The semiconductor memory device of claim 32, wherein
a second group of ones of the at least one hierarchical array is connected to at least one of the plurality of input circuits, and
the hierarchical write circuit is connected to the second hierarchical array group.

34. The semiconductor memory device of claim 33, wherein
the hierarchical write circuit is provided adjacent to the plurality of input circuits.

35. The semiconductor memory device of claim 27, wherein
the hierarchical write circuit includes a delay element, and after the first control circuit drives the pair of local bit lines, the second control circuit drives the pair of local bit lines.

36. The semiconductor memory device of claim 27, wherein
a variable capacitance capacitor is used as the second control circuit.

37. The semiconductor memory device of claim 27, wherein
in a layout of each of the at least one hierarchical array, a middle of each of the pair of local bit lines is connected to the hierarchical write circuit.

38. The semiconductor memory device of claim 27, wherein in a layout of each of the at least one hierarchical array, opposite ends of each of the pair of local bit lines are connected to the hierarchical write circuit.

39. The semiconductor memory device of claim 27, wherein in a layout of each of the at least one hierarchical arrays, one end of each of the pair of local bit lines is connected to the hierarchical write circuit.

* * * * *